(12) United States Patent
Song et al.

(10) Patent No.: US 11,800,614 B2
(45) Date of Patent: *Oct. 24, 2023

(54) LIGHTING APPARATUS AND LIGHTING SYSTEM INCLUDING THE SAME

(71) Applicant: Seoul Semiconductor Co., Ltd., Ansan-si (KR)

(72) Inventors: Jun Ho Song, Ansan-si (KR); BoYong Han, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/092,335

(22) Filed: Jan. 1, 2023

(65) Prior Publication Data

US 2023/0148073 A1 May 11, 2023

Related U.S. Application Data

(63) Continuation of application No. 17/392,160, filed on Aug. 2, 2021, now Pat. No. 11,546,978, which is a
(Continued)

(51) Int. Cl.
*H05B 45/20* (2020.01)
*H05B 45/10* (2020.01)
(Continued)

(52) U.S. Cl.
CPC .......... *H05B 45/20* (2020.01); *H01L 25/0753* (2013.01); *H01L 33/50* (2013.01);
(Continued)

(58) Field of Classification Search
CPC ........ H05B 45/20; H05B 45/10; H05B 47/11; H05B 47/16; H05B 47/175; H05B 47/19;
(Continued)

(56) References Cited

U.S. PATENT DOCUMENTS 10,231,305 B2 3/2019 Yamakawa et al.
10,473,274 B2 11/2019 Yamakawa et al.
(Continued)

FOREIGN PATENT DOCUMENTS

CN 101467489 6/2009
CN 107710425 2/2018
(Continued)

OTHER PUBLICATIONS

Non-Final Office Action dated Mar. 20, 2020, in U.S. Appl. No. 16/698,836.
(Continued)

*Primary Examiner* — Minh D A
(74) *Attorney, Agent, or Firm* — H.C. Park & Associates, PLC

(57) ABSTRACT

A lighting apparatus including a controller and an LED luminaire to implement a color temperature from a minimum of 3,000K or less to a maximum of 5,000K or more, the LED luminaire including at least one first light emitter, at least one second light emitter, and at least one third light emitter, in which a triangle region defined by color coordinates of the light emitters includes at least a region on a Planckian locus, and the maximum and minimum color temperatures in the triangle region are 5,000K or more, and 3,000K or less, respectively, and in the CIE-1931 coordinate system, the color coordinates of the first light emitter is closer to 5,000K than those of the second and third light emitters, and the color coordinates of the third light emitter is closer to 3,000K than those of the first and second light emitters.

20 Claims, 16 Drawing Sheets

Related U.S. Application Data continuation of application No. 16/698,836, filed on Nov. 27, 2019, now Pat. No. 11,083,060.

(60) Provisional application No. 62/776,098, filed on Dec. 6, 2018, provisional application No. 62/773,364, filed on Nov. 30, 2018.

(51) Int. Cl.
| | | |
|---|---|---|
| *H05B 47/16* | (2020.01) | |
| *H01L 25/075* | (2006.01) | |
| *H01L 33/50* | (2010.01) | |
| *H05B 47/175* | (2020.01) | |
| *H05B 47/11* | (2020.01) | |

(52) U.S. Cl.
CPC .............. *H05B 45/10* (2020.01); *H05B 47/11* (2020.01); *H05B 47/16* (2020.01); *H05B 47/175* (2020.01)

(58) Field of Classification Search
CPC ..... H05B 45/30; H01L 25/0753; H01L 33/50; H01L 25/167; H01L 33/504; Y02B 20/40; F21K 9/64; F21V 9/30; F21V 23/003; F21V 23/0435; F21Y 2115/10
See application file for complete search history.

(56) References Cited

U.S. PATENT DOCUMENTS

| | | | |
|---|---|---|---|
| 11,083,060 B2* | 8/2021 | Song | H01L 25/167 |
| 11,546,978 B2* | 1/2023 | Song | H05B 45/10 |
| 2009/0251057 A1 | 10/2009 | Son et al. | |
| 2010/0245673 A1 | 9/2010 | Thomason | |
| 2014/0035472 A1 | 2/2014 | Raj et al. | |
| 2015/0062892 A1 | 3/2015 | Krames et al. | |
| 2016/0044753 A1 | 2/2016 | Lee | |
| 2016/0254416 A1 | 9/2016 | Cheng | |
| 2016/0286616 A1 | 9/2016 | van de Ven | |
| 2017/0238390 A1 | 8/2017 | Yamakawa et al. | |
| 2018/0077770 A1 | 3/2018 | Sooch et al. | |
| 2018/0153019 A1 | 5/2018 | Forbis et al. | |
| 2018/0160493 A1 | 6/2018 | Picard et al. | |

FOREIGN PATENT DOCUMENTS

| | | |
|---|---|---|
| CN | 107750401 | 3/2018 |
| DE | 102008025864 | 12/2009 |
| JP | 2011-023339 | 2/2011 |
| JP | 2012191225 | 10/2012 |
| JP | 2013149463 | 8/2013 |
| KR | 10-2007-0054499 | 5/2007 |
| KR | 10-2008-0000927 | 1/2008 |
| WO | 2009152916 | 12/2009 |
| WO | 2016208683 | 12/2016 |

OTHER PUBLICATIONS

Non-Final Office Action dated Sep. 2, 2020, in U.S. Appl. No. 16/698,836.
Notice of Allowance dated May 16, 2021, in U.S. Appl. No. 16/698,836.
Extended European Search Report dated Jul. 8, 2022, issued in European Patent Application No. 19889610.2.
Non-Final Office Action dated Jan. 24, 2022, issued to U.S. Appl. No. 17/392,160.
Final Office Action dated May 11, 2022, issued to U.S. Appl. No. 17/392,160.
Notice of Allowance dated Aug. 31, 2022, issued to U.S. Appl. No. 17/392,160.
Office Action dated Oct. 27, 2022, issued to Chinese Patent Application No. 201980003735.0.

* cited by examiner

LIGHTING APPARATUS AND LIGHTING SYSTEM INCLUDING THE SAME

CROSS-REFERENCE TO RELATED APPLICATIONS

This application is a Continuation of U.S. patent application Ser. No. 17/392,160 filed on Aug. 2, 2021, which is a Continuation of U.S. patent application Ser. No. 16/698,836, filed on Nov. 27, 2019, now issued as U.S. Pat. No. 11,083,060, which claims the benefit of U.S. Provisional Application No. 62/773,364, filed on Nov. 30, 2018, and U.S. Provisional Application No. 62/776,098, filed on Dec. 6, 2018, each of which is hereby incorporated by reference for all purposes as if fully set forth herein.

BACKGROUND

Field

Exemplary embodiments relate to a lighting apparatus and a lighting system, and more particularly, to a lighting apparatus using a light emitting diode as a light source, and a lighting system including the same.

Discussion of the Background

Most life on earth has adapted to work in tune with the sun. The human body has also adapted to sunlight over a long period of time. Accordingly, human circadian biorhythm is known to change with the change of sunlight. More particularly, in the morning, cortisol is secreted from the human body under bright sunlight. Cortisol causes more blood to be supplied to the organs of the body to increase the pulse and respiration in response to external stimulus, such as stress, thereby causing the body to awaken and prepare for daytime activity. After active physical activity under active sunlight during the daytime, the body secretes melatonin in the evening to reduce the pulse, body temperature, and blood pressure of the body, thereby assisting in resting and sleeping.

In modern society, however, most people mainly perform physical activities at home or in the office instead of under sunlight. It is common that the time staying indoors in the afternoon is longer than the time for physical activity under sunlight.

However, indoor lighting apparatuses generally exhibit a constant spectral power distribution that significantly differs from the spectral power distribution of sunlight. For example, although a light emitting apparatus using blue, green, and red light emitting diodes can implement white light through combination of a blue color, a green color, and a red color, the light emitting apparatus exhibits a spectral power distribution having peak at a particular wavelength, rather than the spectral power distribution over a broad wavelength spectrum of visible light as in sunlight.

FIG. 1 is a graph depicting a spectral power distribution of black body radiation corresponding to several color temperatures on a Planckian locus in the CIE color coordinate system, and FIG. 2 is a graph depicting spectral power distributions of white light sources based on typical blue light emitting diode chips corresponding to several correlated color temperatures.

Referring to FIG. 1 and FIG. 2, the spectrum of black body radiation like the sun shows higher intensity in the blue wavelength region with increasing color temperature, as in the spectrum of a typical white light source. However, as color temperature increases, the difference between the spectrum of the white light source and the spectrum of the black body radiation becomes clearer. For example, the spectrum of the black body radiation at a temperature of 6,500K shows that the intensity of light gradually decreases from the blue wavelength region to the red wavelength region. However, as shown in FIG. 2, in the white lighting apparatus based on the blue light emitting diode chips, the intensity of light in the blue wavelength region becomes stronger with increasing color temperature.

The human eye lens adapted to the spectrum of sunlight can be damaged by abnormally strong light in the blue wavelength region, thereby causing poor eyesight. Moreover, when retinal cells are exposed to excessive energy in the blue wavelength region, abnormal signals can be transmitted to the brain to abnormally promote or suppress generation of hormones, such as cortisol and melatonin, thereby having a negative effect on the body's circadian rhythm.

The above information disclosed in this Background section is only for understanding of the background of the inventive concepts, and, therefore, it may contain information that does not constitute prior art

SUMMARY

Exemplary embodiments provide a lighting apparatus and a lighting system capable of changing a spectrum power distribution thereof automatically in accordance with a change in spectrum power distribution of sunlight.

Exemplary embodiments also provide a lighting apparatus and a lighting system capable of preventing or relieving damage to the eye lens or retina of a user by light in an abnormal blue wavelength region.

Exemplary embodiments further provide a lighting apparatus and a lighting system capable of maintaining stable operation based on actual time even when an external power source is blocked.

Additional features of the inventive concepts will be set forth in the description which follows, and in part will be apparent from the description, or may be learned by practice of the inventive concepts.

A lighting apparatus according to an exemplary embodiment includes: a controller; an LED driver; and an LED luminaire, in which the LED luminaire implements a color temperature from a minimum color temperature of 3,000K or less to a maximum color temperature of 5,000K or more, and the controller controls the LED driver to change the color temperature of the LED luminaire to correspond to change in color temperature of sunlight.

Accordingly, a lighting apparatus may have a variable color temperature like sunlight throughout a daily cycle.

The maximum color temperature may be 6,000K or more and the minimum color temperature may be 2,700K or less. Furthermore, the maximum color temperature may be 6,500K or more.

The lighting apparatus may further include an RTC (real time clock), by which the lighting apparatus may allow change of the color temperature according to a color temperature schedule of the luminaire even without input of an external signal.

The RTC may be embedded in the controller.

The lighting apparatus may further include RTC power supply.

The RTC power supply may include a super capacitor, such that the RTC can be stably operated for a long period of time even under conditions where temperature increases due to operation of the lighting apparatus.

The controller may control the luminaire to automatically change the color temperature of light emitted therefrom in accordance with the RTC to correspond to the color temperature of sunlight.

The lighting apparatus may automatically adjust the color temperature and brightness of light emitted from the luminaire for a day without external input.

The LED luminaire may include a light emitting apparatus, which may include: at least one first light emitting unit including a UV, violet, or blue light emitting diode chip and a first wavelength converter; at least one second light emitting unit including a UV, violet, or blue light emitting diode chip and a second wavelength converter; and at least one third light emitting unit including a UV, violet, or blue light emitting diode chip and a third wavelength converter, in which a triangle region defined by color coordinates of the first light emitting unit, the second light emitting unit and the third light emitting unit includes at least some section on a Planckian locus, and the maximum color temperature and the minimum color temperature on the Planckian locus included in the triangle region may be 5,000K or more and 3,000K or less, respectively.

Hereinafter, unless specifically stated otherwise, the Planckian locus and certain color coordinates may refer to the Planckian locus and color coordinates in the CIE-1931 coordinate system regulated by American National Standards Institute (ANSI), respectively. The CIE-1931 coordinate system can be easily converted into the 1976 coordinate system through simple numerical modification.

The first to third light emitting units may employ a UV or violet light emitting diode chip only.

The first and second light emitting units may employ a UV or violet light emitting diode chip only, and the third light emitting unit may employ a UV, violet or blue light emitting diode chip. The third light emitting unit may have color coordinates approaching a red color, and thus, may emit lower intensity blue light than the first and second light emitting units.

When the first to third light emitting units do not employ a blue light emitting diode chip or the intensity of light emitted from the blue light emitting diode chip is reduced, the light emitting apparatus can prevent the eye lens or retina of a user from being damaged by light in the blue wavelength band. Furthermore, the light emitting apparatus can implement a color temperature in the range of 3,000K to 5,000K on the Planckian locus, thereby enabling change of the spectrum power distribution thereof corresponding to change in spectrum power distribution of sunlight.

When the maximum color temperature is increased and the minimum color temperature is reduced, the lighting apparatus may implement light more similar to the spectrum of sunlight. For example, the maximum color temperature on the Planckian locus included in the triangle region may be 6,000K or more and the minimum color temperature thereon may be 2,700K or less. Furthermore, the maximum color temperature may be 6,500K or more. Furthermore, the maximum color temperature may be 10,000K or more and the minimum color temperature may be 1,800K or less.

The color coordinates of the second light emitting unit may be placed above the Planckian locus in the CIE-1931 coordinate system, the color coordinates of the first light emitting unit may be closer to a color temperature of 5,000K than those of the second and third light emitting units, and the color coordinates of the third light emitting unit may be closer to a color temperature of 3,000K than those of the first and second light emitting units.

The first, second, and third light emitting units may be configured to be driven in a dimming manner, such that the color temperatures on the Planckian locus included in the triangle region can be consecutively implemented.

The light emitting apparatus may include a plurality of first light emitting units, a plurality of second light emitting units, and a plurality of third light emitting units. With the plurality of light emitting units, the light emitting apparatus can increase light output therefrom.

A lighting system according to another exemplary embodiment includes: a lighting apparatus; and an electronic control unit adapted to input a signal to the lighting apparatus, in which the lighting apparatus includes a controller, an LED driver, and an LED luminaire, the LED luminaire implements a color temperature from a minimum color temperature of 3,000K or less to a maximum color temperature of 5,000K or more, and the controller controls the LED driver to change the color temperature of the LED luminaire corresponding to change in color temperature of sunlight.

The electronic control unit may include a remote controller, a mobile application, a PC or a server. With the electronic control unit, the lighting apparatus may be operated in various modes.

The lighting apparatus may automatically change the color temperature of the LED luminaire corresponding to change in color temperature of sunlight, with the electronic control unit turned off.

The lighting system may further include an RTC embedded in the lighting apparatus.

The lighting apparatus may further include RTC power supply.

In addition, the RTC power supply may include a super capacitor.

With the RTC embedded in the lighting apparatus, the lighting apparatus can change the color temperature over time without input signals by the electronic control unit. In addition, since the lighting apparatus is provided with the RTC power supply, thereby maintaining stable operation based on actual time through supply of power to the RTC even when an external power source is in a turned-off state.

The lighting apparatus may further include a memory storing a color temperature change scenario according to time in each season. Accordingly, the lighting apparatus can provide various color temperature changes per season.

The maximum color temperature may be 6,500K or more and the minimum color temperature may be 2,700K or less. Accordingly, the lighting apparatus may automatically change the color temperature at least in the range of 2,700K to 6,500K.

The LED luminaire may include a light emitting apparatus, which may include at least one first light emitting unit including a UV, violet, or blue light emitting diode chip and a first wavelength converter; at least one second light emitting unit including a UV, violet, or blue light emitting diode chip and a second wavelength converter; and at least one third light emitting unit including a UV, violet, or blue light emitting diode chip and a third wavelength converter, in which a triangle region defined by color coordinates of the first light emitting unit, the second light emitting unit and the third light emitting unit includes at least some section on the Planckian locus, and the maximum color temperature and the minimum color temperature on the Planckian locus included in the triangle region may be 5,000K or more and 3,000K or less, respectively.

Furthermore, the maximum color temperature on the Planckian locus included in the triangle region may be 6,500K or more and the minimum color temperature thereon may be 2,700K or less. Furthermore, the first to third light emitting units may be configured to operate in a dimming manner.

The light emitting apparatus may further include a base, and the first to third light emitting units may be regularly arranged on the base. The first light emitting units, the second light emitting units and the third light emitting units may be arranged in a row or in a matrix.

The first light emitting unit, the second light emitting unit and the third light emitting unit may constitute one group, and the first to third light emitting units in one group may be arranged to form a triangle.

The first to third light emitting units may be arranged such that a group adjacent to one group constituting a triangle constitutes an inverted triangle.

A distance between adjacent first light emitting units, a distance between adjacent second light emitting units, and a distance between adjacent third light emitting units may be the same.

It is to be understood that both the foregoing general description and the following detailed description are exemplary and explanatory and are intended to provide further explanation of the invention as claimed.

DETAILED DESCRIPTION

Figure 1:
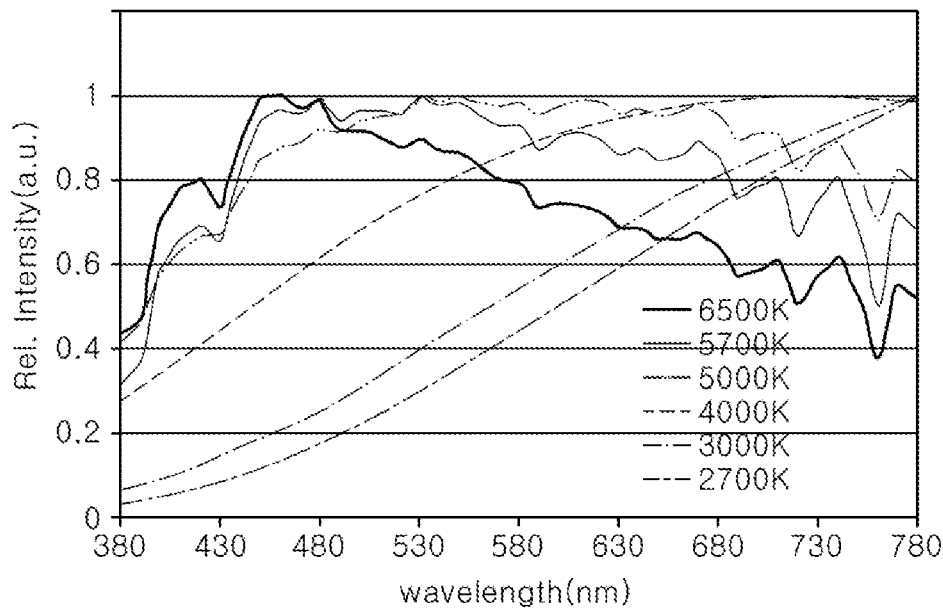
FIG. 1 is a graph depicting a spectral power distribution of black body radiation corresponding to several color temperatures on a Planckian locus in the CIE color coordinate system.
Figure 2:
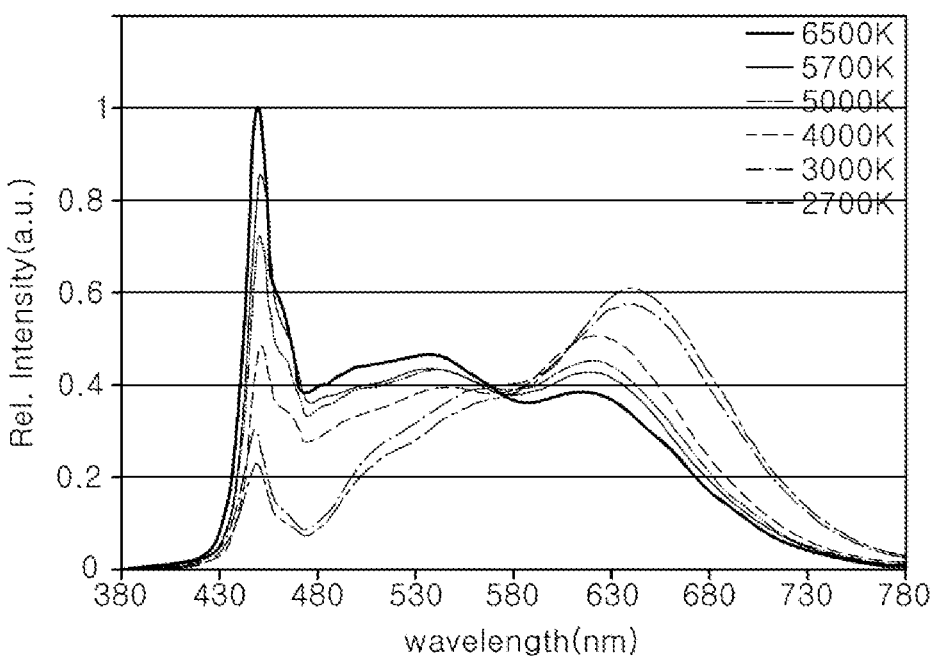
FIG. 2 is a graph depicting spectral power distributions of white light sources based on typical blue light emitting diode chips corresponding to several correlated color temperatures.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 3:
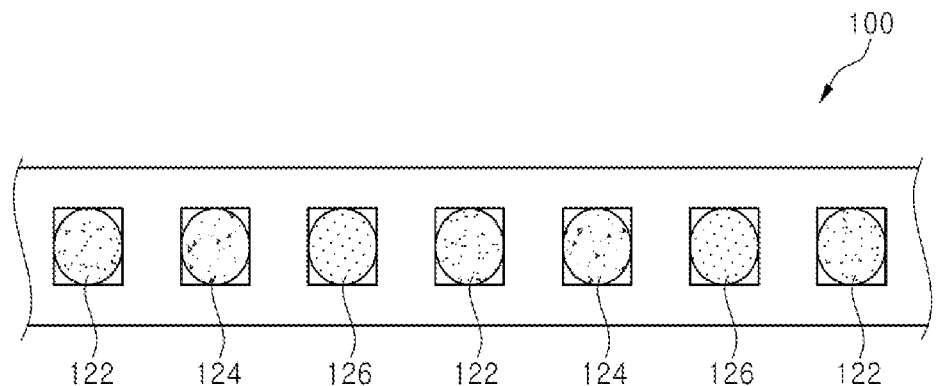
FIG. 3 is a schematic plan view of a light emitting apparatus according to an exemplary embodiment.
Figure 4:
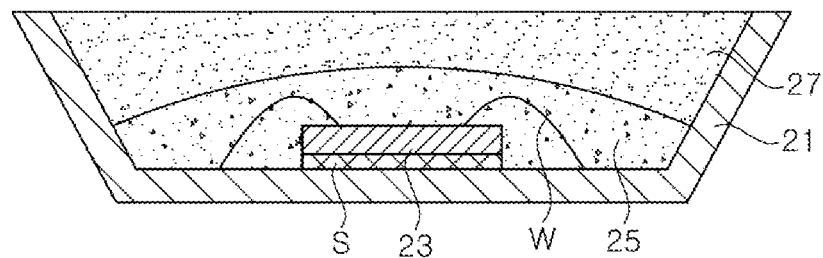
FIG. 4 is a schematic cross-sectional view of a light emitting unit according to an exemplary embodiment.

FIG. 3 is a schematic plan view of a light emitting apparatus according to an exemplary embodiment, and FIG. 4 is a schematic cross-sectional view of a light emitting unit according to an exemplary embodiment.

Referring to FIG. 3, a light emitting apparatus 100 includes a base 110, a first light emitting unit 122, a second light emitting unit 124, and a third light emitting unit 126.

As in a printed circuit board, the base 110 may include circuit wires to supply power to each of the light emitting units 122, 124, 126. In addition, an integrated circuit element may be mounted on the base 110.

The first to third light emitting units 122, 124, 126 may be arranged on the base 110. A plurality of first light emitting units 122, a plurality of second light emitting units 124, and a plurality of third light emitting units 126 may be arranged on the base 110. Further, as shown in FIG. 3, the first to third light emitting units 122, 124, 126 may be repeatedly arranged as a group in a row.

Although the light emitting apparatus 100 of FIG. 3 is illustrated as including three different types of light emitting units 122, 124, 126 arranged on the base 110, the inventive concepts are not limited thereto. For example, in some exemplary embodiments, two types or four or more types of light emitting units may be arranged on the base.

The first to third light emitting units 122, 124, 126 may have a similar structure, and each of the first to third light emitting units 122, 124, 126 generally emits light corresponding to a certain color temperature on the Planckian locus. The structure of each of the light emitting units will be described in more detail with reference to FIG. 4.

Referring to FIG. 4, each of the light emitting units 122, 124, 126 includes a light emitting diode chip 23 and a wavelength converter 25, and may further include a housing 21 and a molding member 27.

The housing 21 may have leads for electrical connection and a cavity.

The light emitting diode chip 23 may be mounted inside the cavity of the housing 21, and is electrically connected to the leads. In general, the light emitting diode chip 23 may be a lateral type light emitting diode chip, and thus, may be electrically connected to the leads by bonding wires.

The light emitting diode chip 23 may emit light having a peak wavelength in the range of 300 nm to 470 nm. For example, the light emitting diode chip 23 may be a blue light emitting diode chip, a violet light emitting diode chip, or a UV light emitting diode chip. In one exemplary embodiment, the light emitting diode chip 23 may emit light having a peak wavelength in the range of 300 nm to 440 nm, specifically 380 nm to 440 nm, more specifically 400 nm to 420 nm.

The first to third light emitting units 122, 124, 126 may include the same type of light emitting diode chip 23 emitting light having the same peak wavelength, without being limited thereto. Alternatively, the first to third light emitting units 122, 124, 126 may include light emitting diode chips configured to emit light having different peak wavelengths within the above range. Each of the first to third light emitting units 122, 124, 126 may emit light having a shorter wavelength than that emitted from a blue light emitting diode chip, and light emitted from the first to third light emitting units 122, 124, 126 can have lower intensity in the blue wavelength region than light emitted from a typical light source. In this case, since most blue light emitted from the third light emitting unit 126 is converted into green or red light through wavelength conversion even when the third light emitting unit 126 uses the blue light emitting diode chip, the blue light emitted from the third light emitting unit 126 may have relatively low intensity. Accordingly, even when the third light emitting unit 126 uses the blue light emitting diode chip, the blue light emitted from the third light emitting unit 126 does not damage the retina of a user. As such, in some exemplary embodiments, the first and second light emitting units 122, 124 may adopt the UV or violet light emitting diode chip, and the third light emitting unit 126 may adopt the blue light emitting diode chip.

The wavelength converter 25 may be disposed inside the cavity of the housing 21 and cover the light emitting diode chip 23. The wavelength converter 25 converts light emitted from the light emitting diode chip 23 into light having a longer wavelength than the wavelength of light.

The wavelength converter 25 may include at least one type of phosphor. With the light emitting diode chip 23 and the wavelength converter 25, the light emitting unit may emit light having a desired color temperature.

The wavelength converter 25 may include, for example, a blue phosphor, a green phosphor, a yellow phosphor, or a red phosphor. The blue phosphor may include BAM, halophosphate, or aluminate-based phosphors, for example, $BaMgAl_{10}O_{17}:Mn^{2+}$, $BaMgAl_{12}O_{19}:Mn^{2+}$, or $(Sr,Ca,Ba)PO_4Cl:Eu^{2+}$. The blue phosphor may have a peak wavelength in the range of, for example, 440 nm to 500 nm.

The green or yellow phosphor may include $LuAG(Lu_3(Al,Gd)_5O_{12}:Ce^{3+})$, $YAG(Y_3(Al,Gd)_5O_{12}:Ce_{3+})$, $Ga^-LuAG$ $((Lu,Ga)_3(Al,Gd)_5O_{12}:Ce^{3+})$, $Ga$-$YAG$ $((Ga,Y)_3(Al,Gd)_5O_{12}:Ce^{3+})$, $LuYAG$ $((Lu,Y)_3(Al,Gd)_5O_{12}:Ce^{3+})$, ortho-silicate $((Sr,Ba,Ca,Mg)_2SiO_4:Eu_{2+})$, oxynitride $((Ba,Sr,Ca)Si_2O_2N_2:Eu_{2+})$, or thiogallate $(SrGa_2S_4:Eu^{2+})$. The green or yellow phosphor may have a peak wavelength in the range of 500 nm to 600 nm.

The red phosphor may include nitride, sulfide, fluoride or oxynitride based phosphors, specifically, CASN $(CaAlSiN_3:Eu^{2+})$, $(Ba,Sr,Ca)_2Si_5N_8:Eu^{2+}$, $(Ca,Sr)S_2:Eu^{2+})$, or $(Sr,Ca)_2SiS_4:Eu^{2+}$. The red phosphor may have a peak wavelength in the range of 600 nm to 700 nm.

The molding member 27 is formed in the cavity of the housing 21 to cover the wavelength converter 25. The molding member 27 is formed of a light transmissive material. For example, the molding member 27 may be formed of methyl silicone or phenyl silicone, specifically phenyl silicone. Although the phenyl silicone is likely to suffer from a yellowing phenomenon upon exposure to UV light, the phenyl silicone has higher strength than the methyl silicone. In particular, according to an exemplary embodiment, since light emitted from the light emitting diode chip 23 is converted into light having a longer wavelength by the wavelength converter 25, the yellowing phenomenon may not occur, and thus, the light emitting diode chip may employ phenyl silicone.

Although the molding member 27 in FIG. 4 is illustrated as covering the wavelength converter 25, in some exemplary embodiments, the molding member 27 may be integrally formed with the wavelength converter 25. In particular, the wavelength converter 25 may include the molding member together with the phosphor, thereby obviating the need for a separate molding member covering the wavelength converter.

Figure 5:
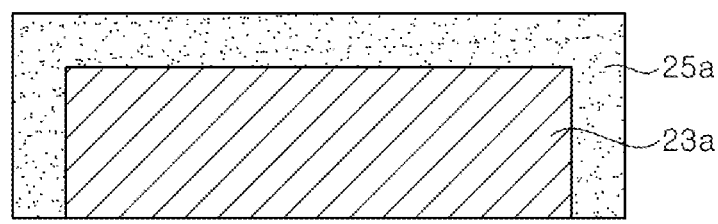
FIG. 5 is a schematic cross-sectional view of a light emitting unit according to another exemplary embodiment.

The light emitting diode chip 23 according to the illustrated exemplary embodiment is described with reference to a lateral type, which is electrically connected to the leads by the bonding wires. However, the inventive concepts are not limited thereto. For example, in some exemplary embodiments, the light emitting diode chip 23 may be a vertical type or flip chip type light emitting diode chip. In addition, the vertical or flip chip type light emitting diode chip may be mounted inside the cavity of the housing 21. Furthermore, the flip chip type light emitting diode chip may be directly mounted on the base 110 without the housing 21. FIG. 5 exemplarily shows a light emitting unit including the flip chip type light emitting diode chip 23a. The wavelength converter 25a may cover upper and side surfaces of the light emitting diode chip 23a. Bonding pads are formed on a lower surface of the light emitting diode chip 23a, whereby the light emitting diode chip 23a having the wavelength converter 25a thereon can be directly mounted on the base 110 via the bonding pads.

Figure 6:
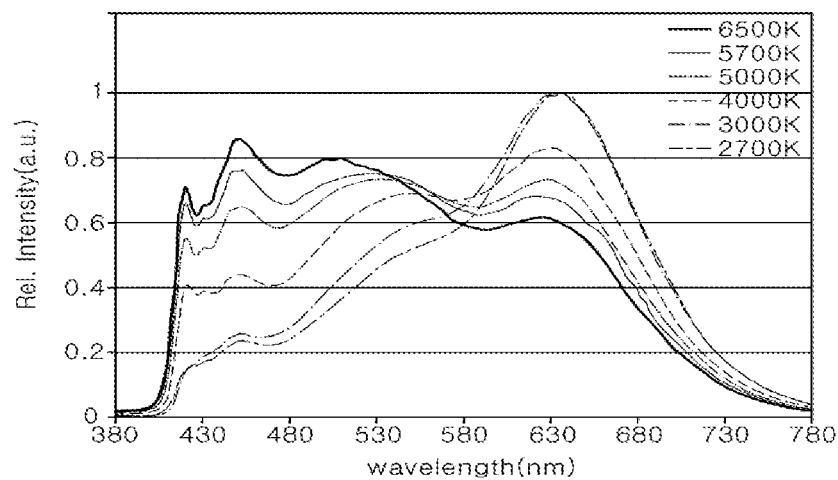
FIG. 6 is a graph depicting spectrum power distributions of various light emitting units according to exemplary embodiments.

As described above, each of the first to third light emitting units 122, 124, 126 emits light corresponding to the color temperature on the Planckian locus, and this structure will be described in detail with reference to FIG. 6. FIG. 6 is a graph depicting spectrum power distributions of various light emitting units according to exemplary embodiments.

Referring to FIG. 6, the spectrum power distributions of light emitting units configured to emit light having correlated color temperatures from 2,700K to 6,500K are shown. Each of the light emitting units includes a light emitting diode chip, which emits light having a shorter wavelength than that emitted from a blue light emitting diode chip, and a wavelength converter, and has an average color rendering index of 95 or more. The light emitting diode chip may have a peak wavelength of, for example, about 416 nm, and the phosphors are suitably selected so as to implement the correlated color temperature of each of the light emitting units and an average color rendering index of 95 or more.

As shown in FIG. 6, as the color temperature increases from 2,700K to 6,500K, the intensity of light in the blue wavelength region increases. However, since light in the blue wavelength region is emitted from blue phosphors, light does not exhibit abnormally high intensity at a particular wavelength region. Furthermore, light emitted from the phosphors has higher intensity than light emitted from the light emitting diode chip.

Accordingly, the light emitting units according to the exemplary embodiments can reduce the intensity of light in the blue wavelength region, as compared with a typical light emitting unit adopting a typical blue light emitting diode chip.

Furthermore, a difference in spectrum between a white light source based on the typical blue light emitting diode chip and a light source based on the light emitting units according to the exemplary embodiments can be clearly confirmed through the fidelity index Rf calculated by IES TM-30-15. Table 1 shows average color rendering indices (CRI) and fidelity indices according to the correlated color temperatures of the light sources based on the blue light emitting diode chip, and Table 2 shows average color rendering indices (CRI) and fidelity indices according to the correlated color temperatures of the light emitting units according to the exemplary embodiments.

TABLE 1

CRI and fidelity indices of light sources based on a blue light emitting diode chip and light sources based on a violet light emitting diode chip.

| CCT | | 6,500 K. | 5,700 K. | 5,000 K. | 4,000 K. | 3,000 K. | 2,700 K. |
|---|---|---|---|---|---|---|---|
| Blue- | CRI | 96.8 | 96.2 | 96.1 | 95.6 | 95.3 | 96.8 |
| base | Rf | 91.3 | 90.6 | 90.0 | 89.1 | 93.3 | 94.5 |
| Violet- | CRI | 98.6 | 98.1 | 98.1 | 97.7 | 97.8 | 97.2 |
| base | Rf | 97.7 | 98.1 | 98.3 | 97.7 | 97.3 | 96.7 |

Referring to Table 1, although the typical light sources based on the blue light emitting diode chip have a CRI of 95 or more, the typical light sources have relatively low fidelity indices. In particular, while a difference between the CRI and the fidelity index is not large in a region having a low correlated color temperature, the difference between the CRI and the fidelity index is large in a region having a high correlated color temperature.

On the other hand, it can be seen that the violet light emitting diode chip-based light emitting units according to the exemplary embodiments do not have a large difference between the CRI and the fidelity index. Accordingly, the light emitting apparatus using the light source based on the violet light emitting diode chip can emit light similar to actual sunlight.

When the light emitting units according to the exemplary embodiments are arranged in a single light emitting apparatus, it is possible to implement various color temperatures through the light emitting apparatus.

Figure 7:
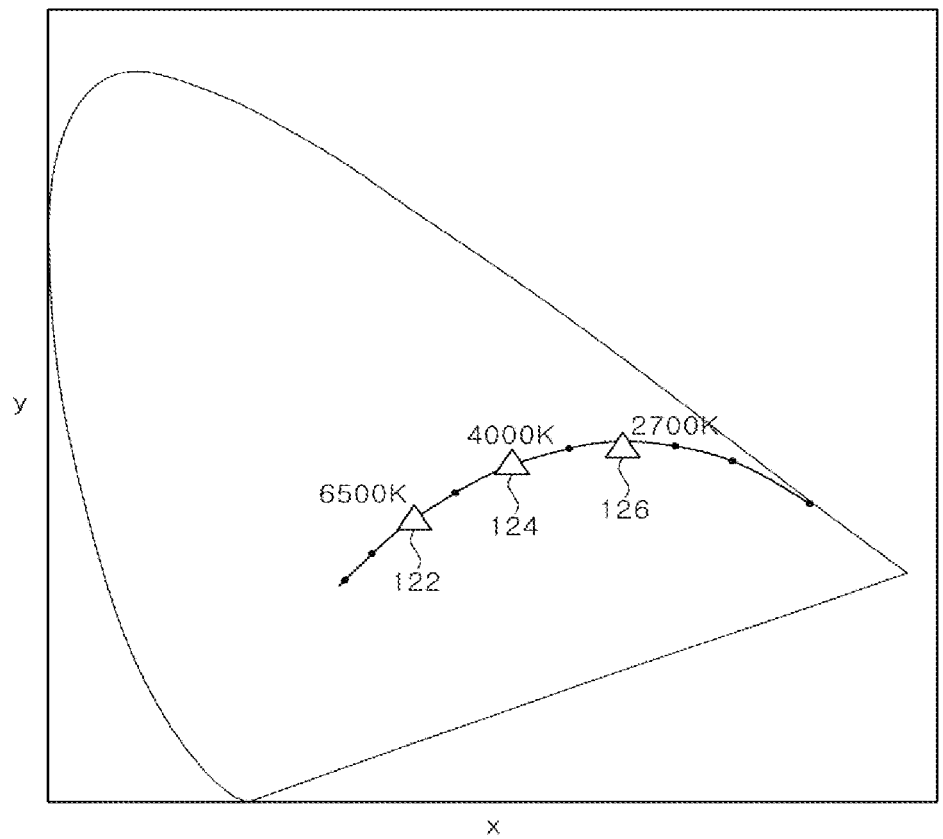
FIG. 7 is a schematic color coordinate graph of a light emitting apparatus according to an exemplary embodiment.

FIG. 7 is a schematic color coordinate graph of a light emitting apparatus according to an exemplary embodiment. Hereinafter, the light emitting apparatus will exemplarily be described with reference to the one shown in FIG. 3 including the first to third light emitting units 122, 124, 126.

The first to third light emitting units 122, 124, 126 may have color temperatures of 6,500K, 4,000K and 2,700K, respectively. As described above with reference to FIG. 3, these light emitting units 122, 124, 126 may be arranged on the base 110.

The light emitting units 126 having a color temperature of 2,700K may implement light that corresponds to sunlight in the morning or in the evening, and the light emitting units 122 having a color temperature of 6,500K may implement light that corresponds sunlight of high noon. Further, the light emitting units 124 having a color temperature of 4,000K may implement light that corresponds to the middle between morning and high noon or the middle between high noon and evening. As such, among the first to third light emitting units 122, 124, 126, particular light emitting units may be operated corresponding to a desired color temperature, thereby allowing change in color temperature of the light source to correspond to change in the spectrum of sunlight in a daily cycle.

Although the first to third light emitting units 122, 124, 126 are described as having the color temperatures of 6500K, 4000K and 2700K, respectively, the inventive concepts are not limited thereto, and in some exemplary embodiments, the light emitting units may have different color temperatures, and the light emitting units 122, 124, 126 are placed on the Planckian locus or near the Planckian locus.

In addition, as described above, among the first to third light emitting units 122, 124, 126, particular light emitting units may be operated to implement light having a particular color temperature. For example, according to an exemplary embodiment, during operation of the first light emitting unit 122, the second and third light emitting units 124, 126 are kept in a turned-off state; during operation of the second light emitting unit 124, the first and third light emitting units 122, 126 are kept in a turned-off state; and during operation of the third light emitting unit 126, the first and second light emitting units 122, 124 are kept in a turned-off state. However, the inventive concepts are not limited thereto. For example, in some exemplary embodiments, the first light emitting unit 122 and the second light emitting unit 124 may be operated in a dimming manner to implement a correlated color temperature between 6,500K and 4,000K, and the second light emitting unit 124 and the third light emitting unit 126 may be operated in a dimming manner to implement a correlated color temperature between 4,000K and 2,700K. In this manner, it is possible to implement light that corresponds to most of the correlated color temperature between 6,500K and 2,700K through combination of the first to third light emitting units 122, 124, 126.

Figure 8:
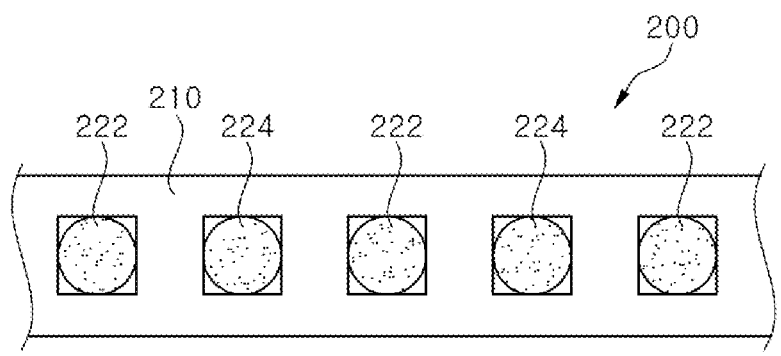
FIG. 8 is a schematic plan view of a light emitting unit according to yet another exemplary embodiment.
Figure 9:
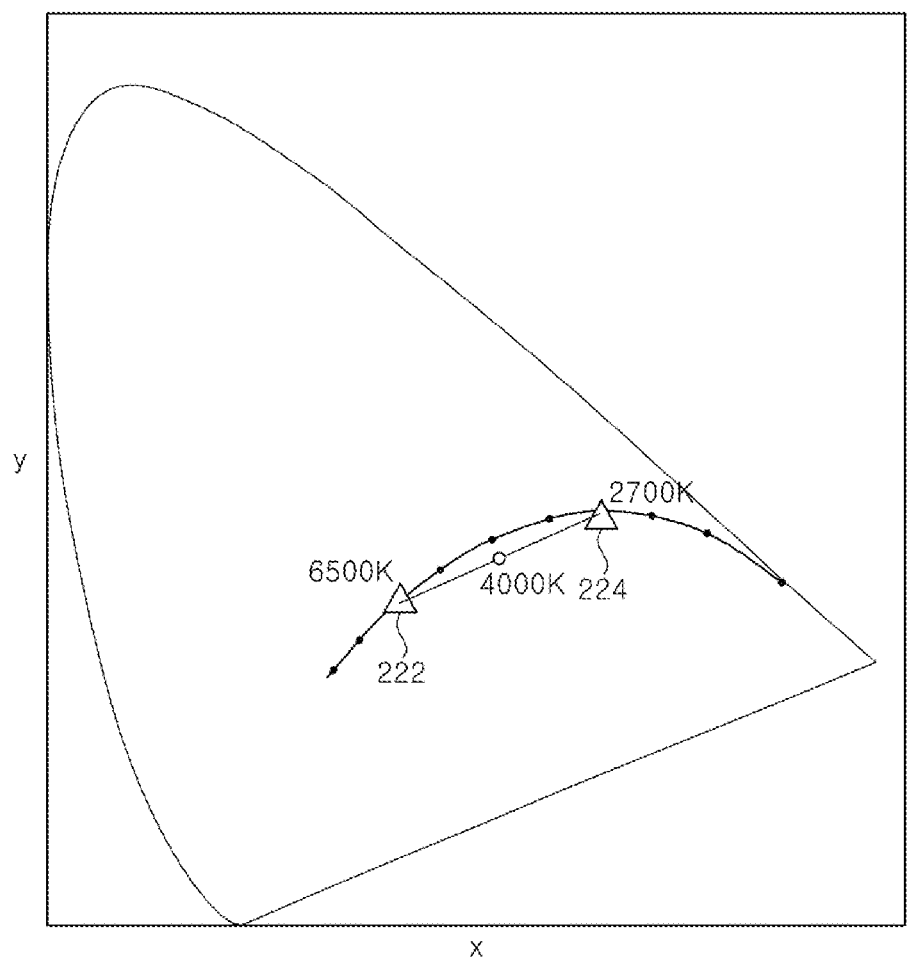
FIG. 9 is a schematic color coordinate graph of a light emitting apparatus of FIG. 8.

FIG. 8 is a schematic plan view of a light emitting apparatus 200 according to another exemplary embodiment, and FIG. 9 is a schematic color coordinate graph of a light emitting apparatus of FIG. 8.

Referring to FIG. 8, the light emitting apparatus 200 according to the illustrated exemplary embodiment is similar to the light emitting apparatus 100 shown in FIG. 3, except that the light emitting apparatus 200 includes two types of light emitting units 222, 224 having different color temperatures. The first light emitting units 222 and the second light emitting units 224 are arranged on a base 210. The first light emitting units 222 and the second light emitting units 224 are alternately arranged.

The base 210 is the same as the base 110 described above, and thus, repeated descriptions thereof will be omitted. In addition, the first light emitting units 222 and the second light emitting units 224 have a similar structure to the structure described with reference to FIG. 4 or FIG. 5, and thus, repeated descriptions thereof will be omitted.

Referring to FIG. 9, the first light emitting unit 222 may have a color temperature of, for example, 6,500K, and the second light emitting unit 224 may have a color temperature of, for example, 2,700K. With the light emitting units 222, 224 having color temperatures of 6,500K and 2,700K, respectively, the light emitting apparatus 200 can implement light corresponding to the spectrum of sunlight at noon and light corresponding to the spectrum of sunlight in the morning or evening.

Furthermore, the first light emitting unit 222 having a color temperature of 6,500K and the second light emitting unit 224 having a color temperature of 2,700K may be operated in a dimming manner, thereby implementing light having different correlated color temperatures between 6,500K and 2,700K. For example, light having a color temperature of 4,000K may be implemented by operating the first light emitting units 222 having a color temperature of 6,500K and the second light emitting units 224 having a color temperature of 2,700K.

According to the illustrated exemplary embodiment, the number of types of the light emitting units can be reduced, thereby simplifying the operation of the light emitting apparatus.

Figure 10:
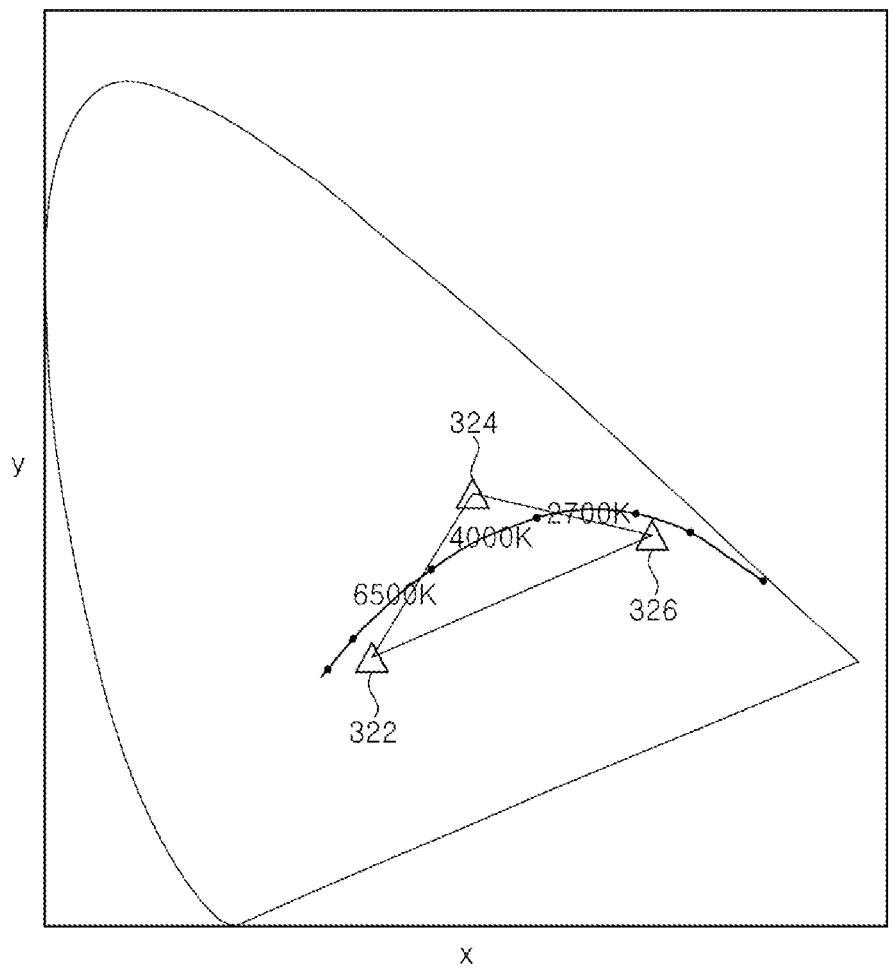
FIG. 10 is a schematic color coordinate graph of a light emitting apparatus according to another exemplary embodiment.

FIG. 10 is a schematic color coordinate graph of a light emitting apparatus according to another exemplary embodiment. The light emitting apparatus according to the illustrated exemplary embodiment includes three types of light emitting units, that is, first to third light emitting units 322, 324, 326, which may be arranged on the base 110, as described with reference to FIG. 3.

As described above, each of the light emitting units 322, 324, 326 includes a UV light emitting diode chip, a violet light emitting diode chip, or a blue light emitting diode chip, and a wavelength converter adapted to convert the wavelength of light emitted from the light emitting diode chip. In an exemplary embodiment, each of the first light emitting unit 322 and the second light emitting unit 324 may include the UV light emitting diode chip or the violet light emitting diode chip, and the third light emitting unit 326 may include the UV light emitting diode chip, the violet light emitting diode chip, or the blue light emitting diode chip. However, the color coordinates of the light emitting units 322, 324, 326 according to the illustrated exemplary embodiment are different from those described with reference to FIG. 7, and are set using the light emitting diode chips and the wavelength converter. Hereinafter, features of the light emitting apparatus according to the illustrated exemplary embodiment will be mainly described.

In the illustrated exemplary embodiment, the first light emitting unit 322, the second light emitting unit 324, and the third light emitting unit 326 are disposed to implement light having a color temperature in the range of 3,000K to 5,000K on the Planckian locus. Unlike the exemplary embodiment shown in FIG. 7, the first to third light emitting units 322, 324, 326 are not required to exhibit the color coordinates on the Planckian locus.

The first light emitting unit 322 may have color coordinates closer to a color temperature of 5,000K than the second and third light emitting units 324, 326, and the third light emitting unit 326 may have color coordinates closer to a color temperature of 3,000K than the first and second light emitting units 322, 324. In an exemplary embodiment, the first light emitting unit 322 may have a color temperature of 5,000K and the third light emitting unit 326 may have a color temperature of 3,000K, for example.

The second light emitting unit 324 has color coordinates placed above the Planckian locus in the CIE-1931 color coordinate system. In particular, the x-coordinate of the second light emitting unit 324 may be placed within the x-coordinate range between a color temperature of 5,000K and a color temperature of 3,000K on the Planckian locus.

Furthermore, any of a straight line connecting the color coordinates of the first light emitting unit 322 to the color coordinates of the second light emitting unit 324, a straight line connecting the color coordinates of the second light emitting unit 324 to the color coordinates of the third light emitting unit 326, and a straight line connecting the color coordinates of the first light emitting unit 322 to the color coordinates of the third light emitting unit 326 may not cross a region between 5,000K and 3,000K on the Planckian locus. More particularly, a triangle region is defined by the color coordinates of the first to third light emitting units 322, 324, 326, and a curved portion between the color temperature of 5,000K and the color temperature of 3,000K on the Planckian locus is placed in the triangle region. In another exemplary embodiment, the straight line connecting the color coordinates of the first light emitting unit 322 to the color coordinates of the second light emitting unit 324 may pass the color temperature of 5,000K, and the straight line connecting the color coordinates of the second light emitting unit 324 to the color coordinates of the third light emitting unit 326 may pass the color temperature of 3,000K. In addition, the straight line connecting the color coordinates of the first light emitting unit 322 to the color coordinates of the third light emitting unit 326 may pass the color temperature of 5,000K or the color temperature of 3,000K.

According to the illustrated exemplary embodiment, the first to third light emitting units 322, 324, 326 are operated in a dimming manner, thereby implementing light having any color temperature in the range of 3,000K to 5,000K on the Planckian locus. Furthermore, since none of the first to third light emitting units 322, 324, 326 include a blue light emitting diode chip, the light emitting apparatus can prevent emission of light having abnormally high intensity in the blue wavelength region.

The light emitting apparatus according to the illustrated exemplary embodiment may implement a maximum color temperature CTmax of 5,000K or more through selection of the first light emitting unit 322 and the second light emitting unit 324, and a minimum color temperature CTmin of 3,000K or less through selection of the second light emitting unit 324 and the third light emitting unit 326.

The color temperatures of 3,000K and 5,000K are minimum requirements to correspond to change in spectrum of light for a day. Within this range of color temperature, the light emitting apparatus can emit light corresponding to change in spectrum of sunlight.

In order to implement light further similar to sunlight, the maximum color temperature CTmax may be further increased and the minimum color temperature CTmin may be further decreased. For example, the maximum color temperature CTmax may be 6,000K or more, specifically 6,500K or more, more specifically 10,000K or more. In addition, the minimum color temperature CTmin may be 2,700K or less, specifically 1,800K or less.

The first light emitting unit 322 has the same x-coordinate as, or a smaller x-coordinate than, the x-coordinate of the color coordinates corresponding to the maximum color temperature CTmax in a color temperature range to be implemented thereby; the second light emitting unit 324 has an x-coordinate in a color temperature range to be implemented thereby; and the third light emitting unit 326 has the same x-coordinate as, or a greater x-coordinate than the x-coordinate, of the color coordinates corresponding to the minimum color temperature CTmin in a color temperature range to be implemented thereby.

Figure 11:
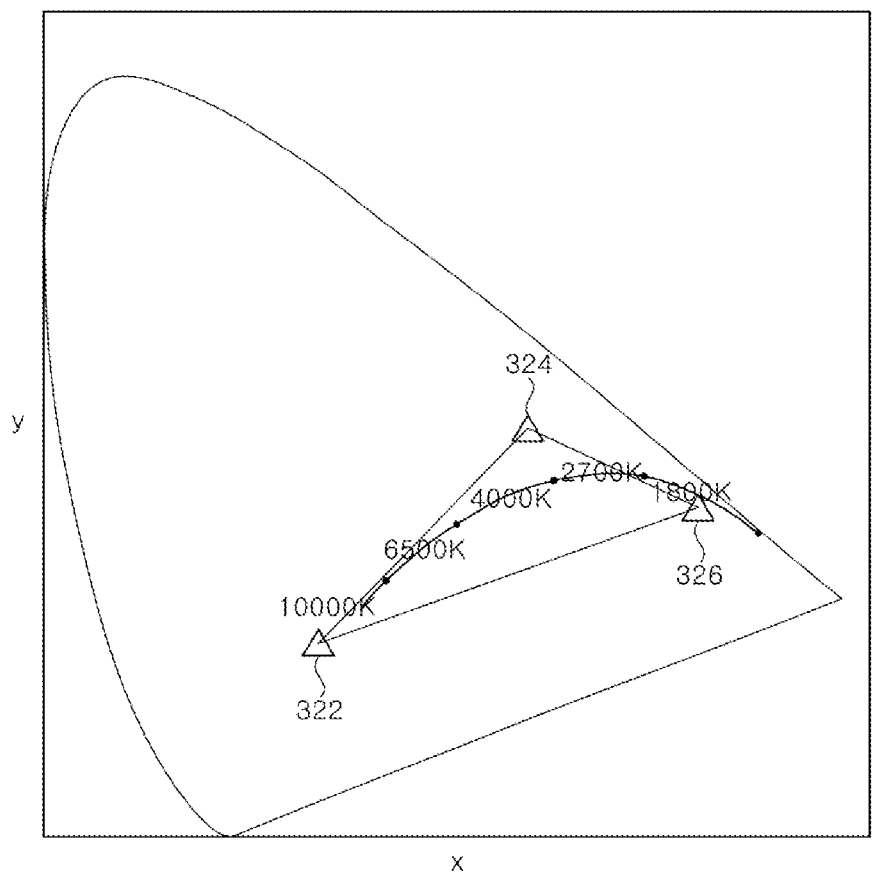
FIG. 11 is a schematic color coordinate graph of a light emitting apparatus according to another exemplary embodiment.

For example, FIG. 11 is a schematic color coordinate graph of a light emitting apparatus capable of implementing a color temperature in the range of 1,800K to 10,000K on the Planckian locus. The first light emitting unit 322 has the same x-coordinate as or a smaller x-coordinate than an x-coordinate of the color temperature of 10,000K; the second light emitting unit 324 has an x-coordinate of a color temperature in the range of 1,800K to 10,000K; and the third light emitting unit 326 has the same x-coordinate as or a greater x-coordinate than an x-coordinate of the color temperature of 1,800K. On the other hand, the y-coordinate of the second light emitting unit 324 is set such, that the color coordinates of the second light emitting unit 324 are placed above the Planckian locus. In addition, the y-coordinate of each of the first light emitting unit 322 and the third light emitting unit 326 is set between 0 and 1, such that the triangle region defined by the color coordinates of the first to third light emitting units 322, 324, 326 include the Planckian locus between the color temperature of 1,800K and the color temperature of 10,000K.

In the illustrated exemplary embodiments of FIG. 10 and FIG. 11, the color temperatures on the Planckian locus may be implemented by operating the first to third light emitting units 322, 324, 326 in a dimming manner. Accordingly, the light emitting apparatus according to exemplary embodiments can implement all color temperatures ranging from the minimum color temperature CTmin to the maximum color temperature CTmax. A color temperature excluding the maximum color temperature CTmax and the minimum color temperature CTmin may be implemented by operating each of the three types of light emitting units 322, 324, 326. The maximum color temperature CTmax may be implemented by the first light emitting unit 322 or through combination of the first light emitting unit 322 and the second light emitting unit 324, combination of the first light emitting unit 322 and the third light emitting unit 326, or combination of the first to third light emitting units 322, 324, 326, and the minimum color temperature CTmin may be implemented by the third light emitting unit 326 or through combination of the second light emitting unit 324 and the third light emitting unit 326, combination of the first light emitting unit 322 and the third light emitting unit 326, or combination of the first to third light emitting units 322, 324, 326. In this manner, most color temperatures can be implemented by operating each of the three types of light emitting units 322, 324, 326 in a dimming manner. In the light emitting apparatus described reference with to FIG. 7, some light emitting units stop to operate and are on standby to implement a particular color temperature. However, in the illustrated exemplary embodiment, each of the light emitting units may be operated, thereby enabling reduction in the number of light emitting units for a luminaire.

Figure 12:
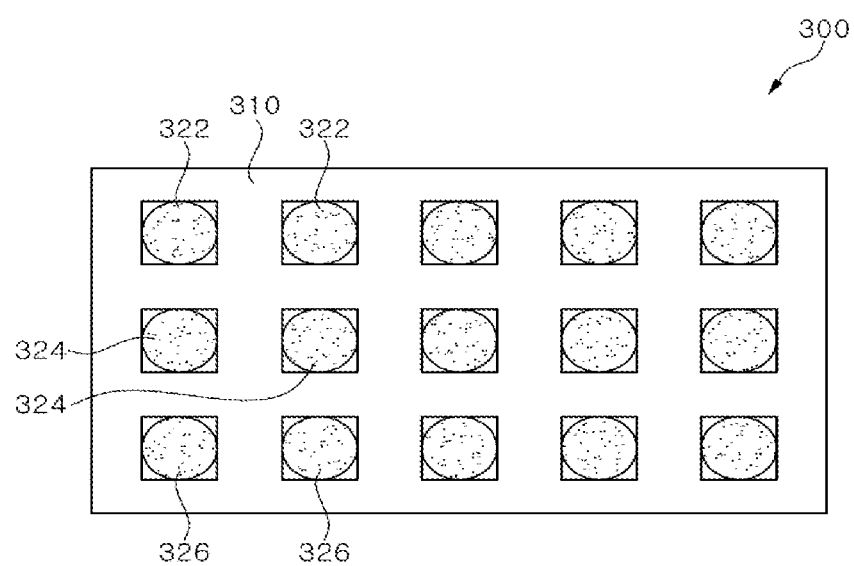
FIG. 12 is a schematic plan view of a light emitting apparatus according to yet another exemplary embodiment.
Figure 13:
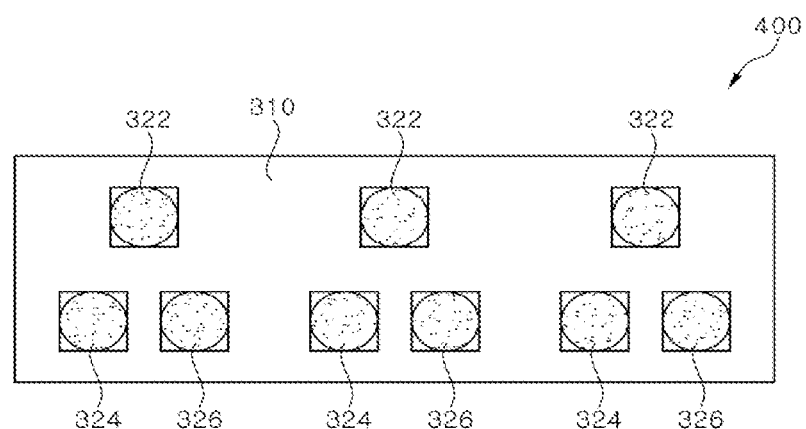
FIG. 13 is a schematic plan view of a light emitting apparatus according to yet another exemplary embodiment.
Figure 14:
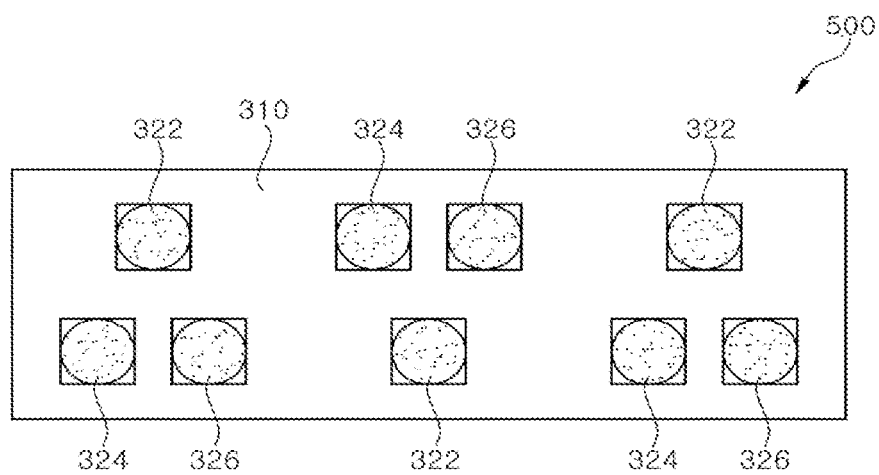
FIG. 14 is a schematic plan view of a light emitting apparatus according to yet another exemplary embodiment.

On the other hand, as described with reference to FIG. 3, the first to third light emitting units 322, 324, 326 may be repeatedly arranged in a row on the base 310. However, the inventive concepts are not limited thereto, and the light emitting units may be arranged in various ways. FIG. 12 to FIG. 14 show light emitting apparatuses 300, 400, 500, in which the first to third light emitting units 322, 324, 326 are arranged on the base 310 in various ways. Hereinafter, the base 310 is similar to the base 110 described with reference to FIG. 3, and thus, repeated descriptions thereof will be omitted.

Referring to FIG. 12, the first to third light emitting units 322, 324, 326 according to an exemplary embodiment may be arranged in a matrix. For example, the first light emitting units 322 may be arranged in a first line, the second light emitting units 324 may be arranged in a second line adjacent thereto, and the third light emitting units 326 may be arranged in a third line adjacent to the second line. Further, the first to third light emitting units 322, 324, 326 may be arranged together in the same row.

Referring to FIG. 13, the first light emitting unit 322, the second light emitting unit 324, and the third light emitting unit 326 according to another exemplary embodiment may be arranged as one group in a triangular shape, and groups of these light emitting units may be repeated in the same way. According to the illustrated exemplary embodiment, the light emitting apparatus 400 can emit more uniform light than the light emitting apparatus 300 shown in FIG. 12.

Referring to FIG. 14, the first light emitting unit 322, the second light emitting unit 324, and the third light emitting unit 326 according to yet another exemplary embodiment may be arranged as one group in a triangular shape, and groups of these light emitting units may be repeated in an alternating way. More specifically, a group of the first to third light emitting units adjacent to the group of the first to third light emitting units arranged in a triangular shape has an inverted triangular shape. In this manner, the distance between the same types of light emitting units may be constant. For example, each of a distance between the first light emitting units 322, a distance between the second light emitting units 324, and a distance between the third light emitting units 326 may be constant. Accordingly, the light emitting apparatus 500 can emit more uniform light than the light emitting apparatus 400 of FIG. 13.

Figure 15:
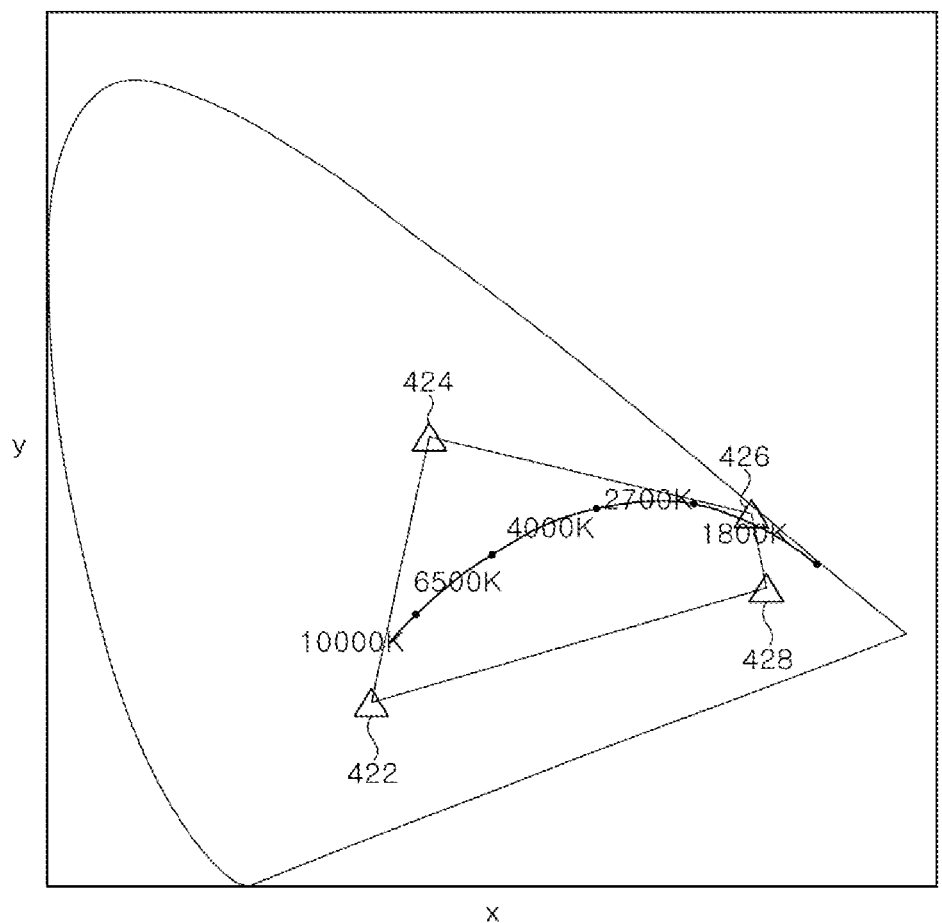
FIG. 15 is a schematic color coordinate graph of a light emitting apparatus according to yet another exemplary embodiment.

FIG. 15 is a schematic color coordinate graph of a light emitting apparatus according to yet another exemplary embodiment.

Referring to FIG. 15, the light emitting apparatus according to the illustrated exemplary embodiment includes first to fourth light emitting units 422, 424, 426, 428. Each of the first to fourth light emitting units 422, 424, 426, 428 includes a UV, violet or blue light emitting diode chip, and a wavelength converter.

A rectangular region is defined by the color coordinates of the first to fourth light emitting units 422, 424, 426, 428, and a demanded Planckian locus is placed in the rectangular region. With this structure, the light emitting apparatus can implement all of color temperatures on the Planckian locus placed in the rectangular region through combination of the first to fourth light emitting units 422, 424, 426, 428.

In particular, the first light emitting unit 422 may have color coordinates near a color temperature of 10,000K, and the second light emitting unit 424 may have color coordinates placed above the Planckian locus in the CIE-1931 coordinate system. Each of the third light emitting unit 426 and the fourth light emitting unit 428 may have color coordinates near a color temperature of 1,800K, in which the color coordinates of the third light emitting unit 426 may be placed above the Planckian locus and the color coordinates of the fourth light emitting unit 428 may be placed below the Planckian locus.

In the illustrated exemplary embodiment, in order to reduce the intensity of blue light emitted from the blue light emitting diode chip, the first and second light emitting units 422, 424 may employ a UV or violet light emitting diode chip, instead of the blue light emitting diode chip. Even with the blue light emitting diode chip, the third and fourth light emitting units 426, 428 emit low intensity blue light, and thus, may not damage the retina. Accordingly, the third and fourth light emitting units 426, 428 may include any light emitting diodes selected from among the UV, violet, and blue light emitting diode chips, as desired.

According to the illustrated exemplary embodiment, the light emitting apparatus can implement a color temperature in the range of 1,800K to 10,000K. However, the inventive concepts are not limited thereto, and in some exemplary embodiments, the first to fourth light emitting units 422, 424, 426, 428 may be set to implement a color temperature in the range of, for example, 3,000K to 5,000K or more.

Figure 16:
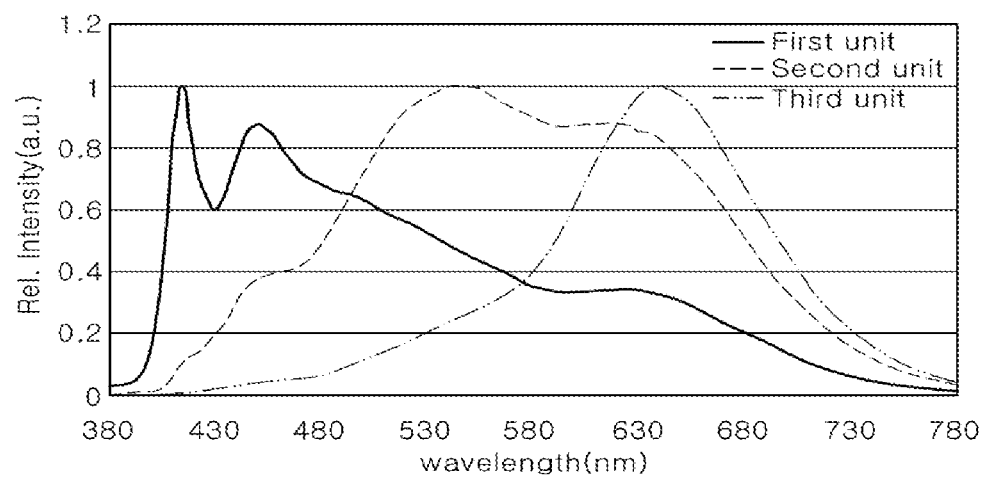
FIG. 16 is a graph depicting spectrum power distributions of light emitting units according to an exemplary embodiment.

FIG. 16 is a graph depicting spectrum power distributions of first to third light emitting units according to an exemplary embodiment, and FIG. 17 to FIG. 28 are graphs comparing various spectra implemented using the light emitting units of FIG. 16 with the spectrum of black body radiation (reference light source) at correlated color temperatures corresponding thereto.

Each of the first to third light emitting units according to an exemplary embodiment includes violet light emitting diode chips having a peak wavelength of about 416 nm. Further, the first light emitting unit includes a blue phosphor, a green phosphor, a yellow phosphor, and a red phosphor, and has color coordinates (x, y) of (0.2638, 0.2756), a correlated color temperature of 13,597K and Duv of 0.0043. The second light emitting unit includes a blue phosphor, a green phosphor, a yellow phosphor, and a red phosphor, and has color coordinates (x, y) of (0.3860, 0.4354), a correlated color temperature of 4,222K and Duv of 0.0236. The third light emitting unit includes a blue phosphor, a green phosphor, a yellow phosphor, and a red phosphor, and has color coordinates (x, y) of (0.5439, 0.4055), a correlated color temperature of 1,822K and Duv of 0.000.

Figure 17:
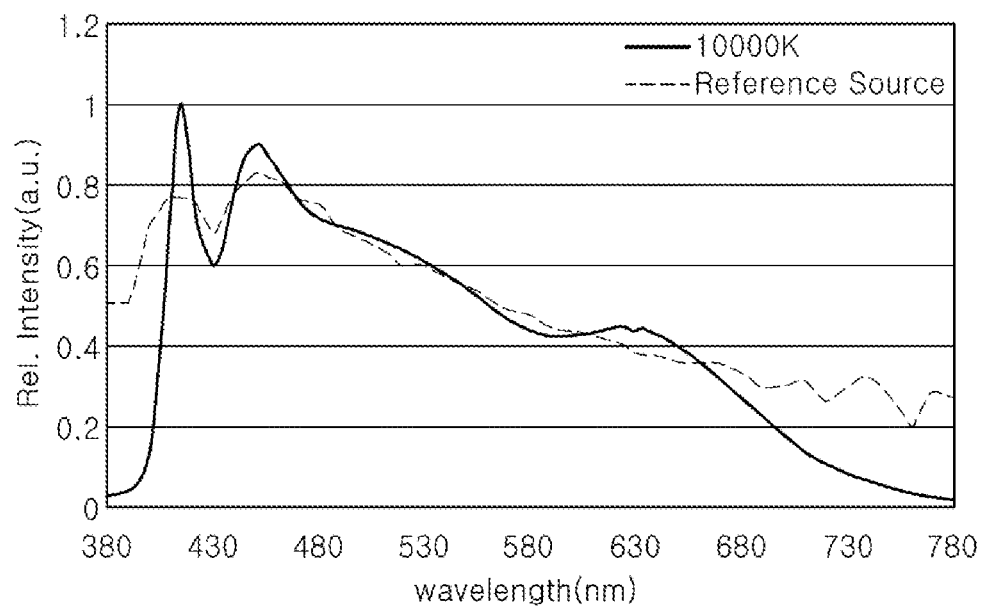
FIGS. 17, 18, 19, 20, 21, 22, 23, 24, 25, 26, 27, and 28 are graphs comparing various spectra implemented using the light emitting units of FIG. 16 with the spectrum of black body radiation (reference light source) at correlated color temperatures corresponding thereto.
Figure 18:
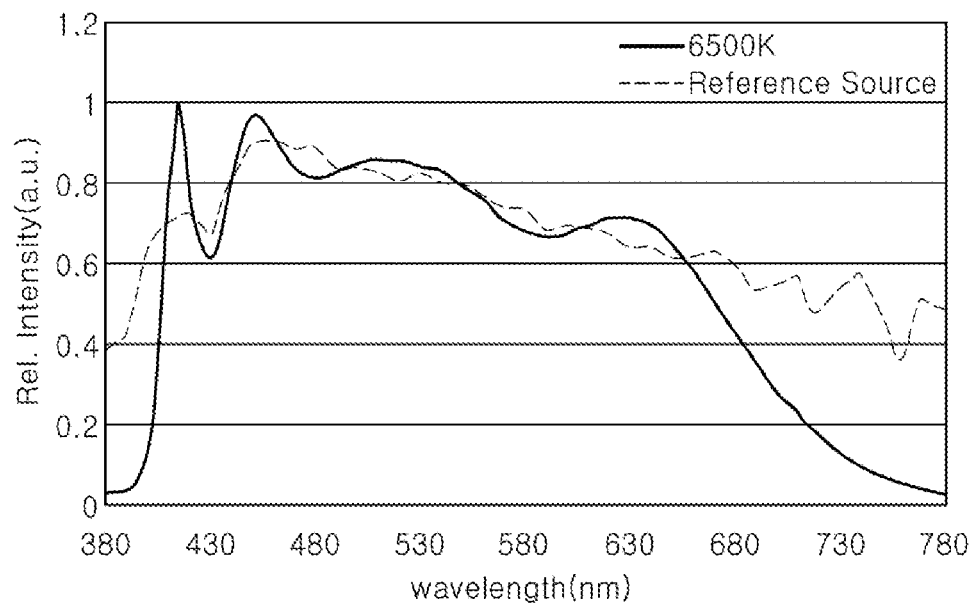
Figure 19:
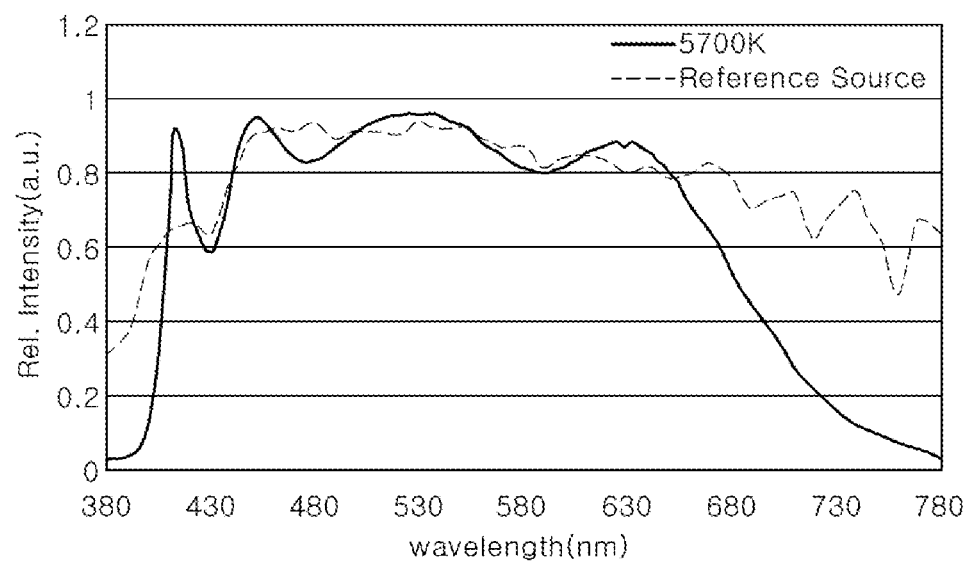
Figure 20:
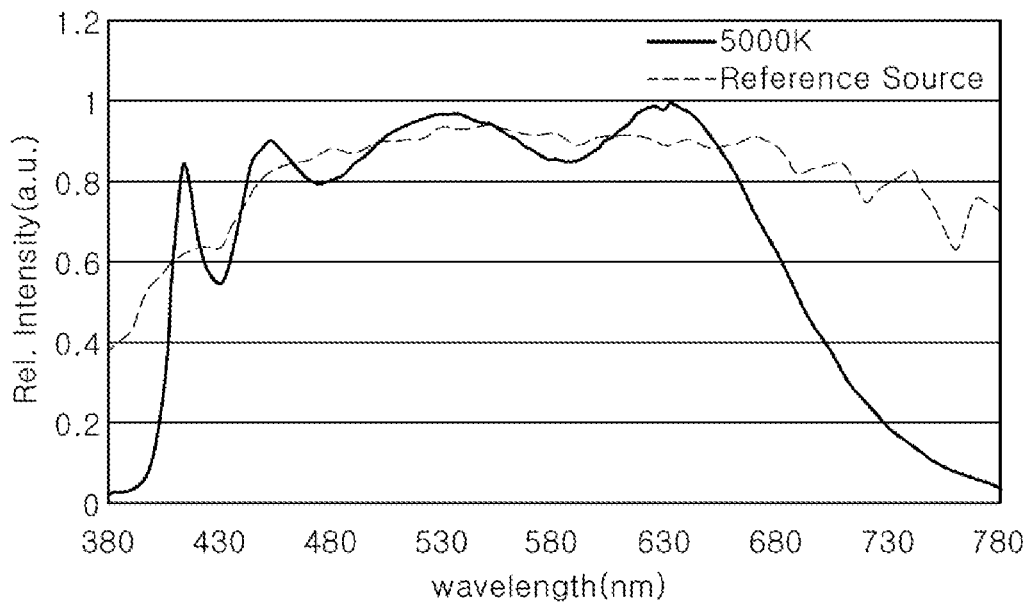
Figure 21:
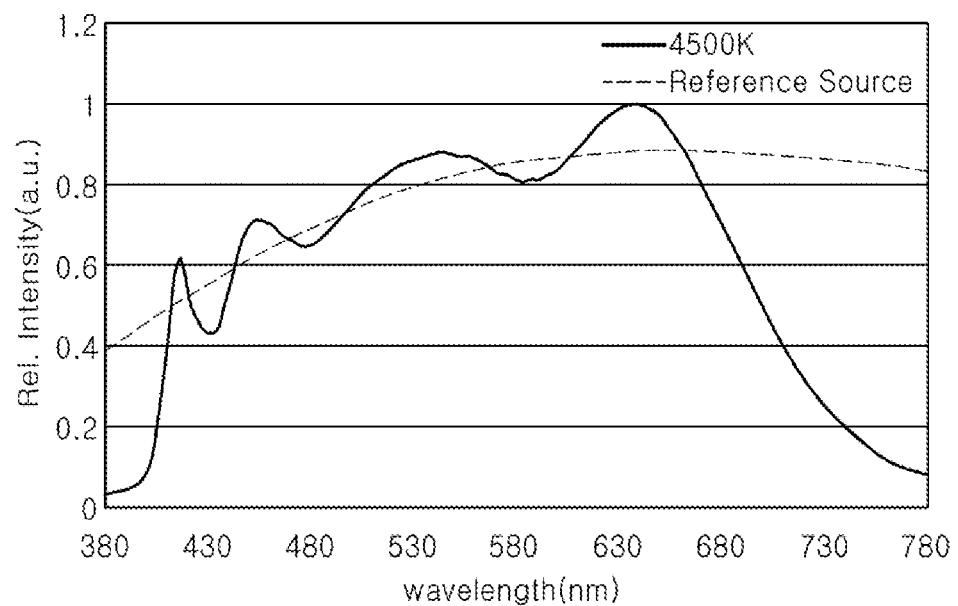
Figure 22:
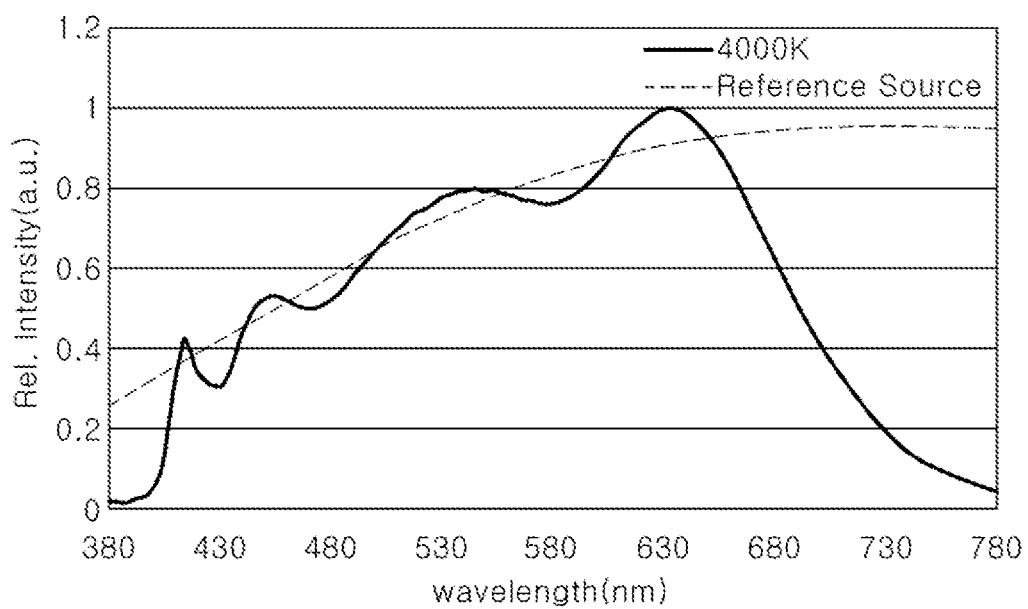
Figure 23:
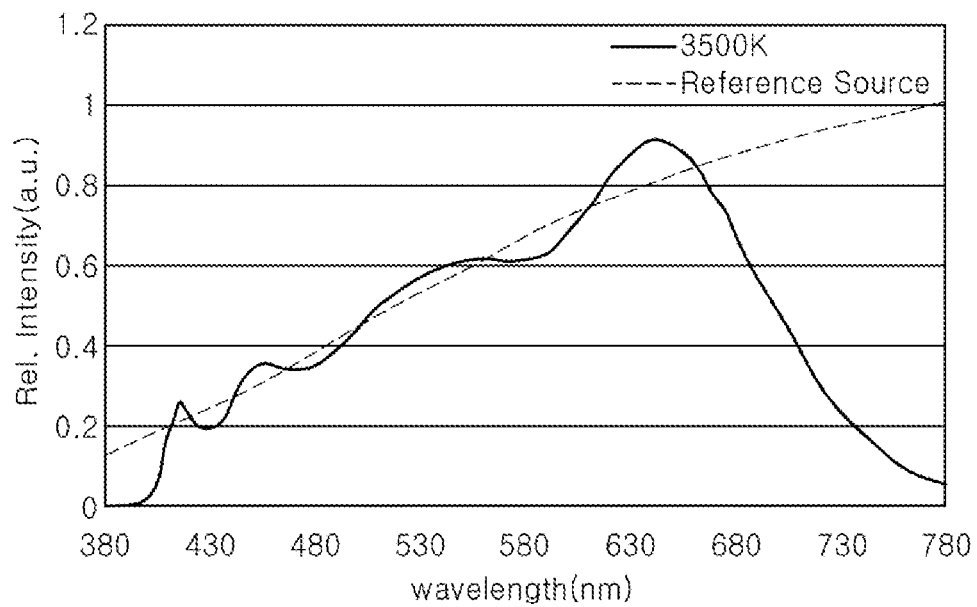
Figure 24:
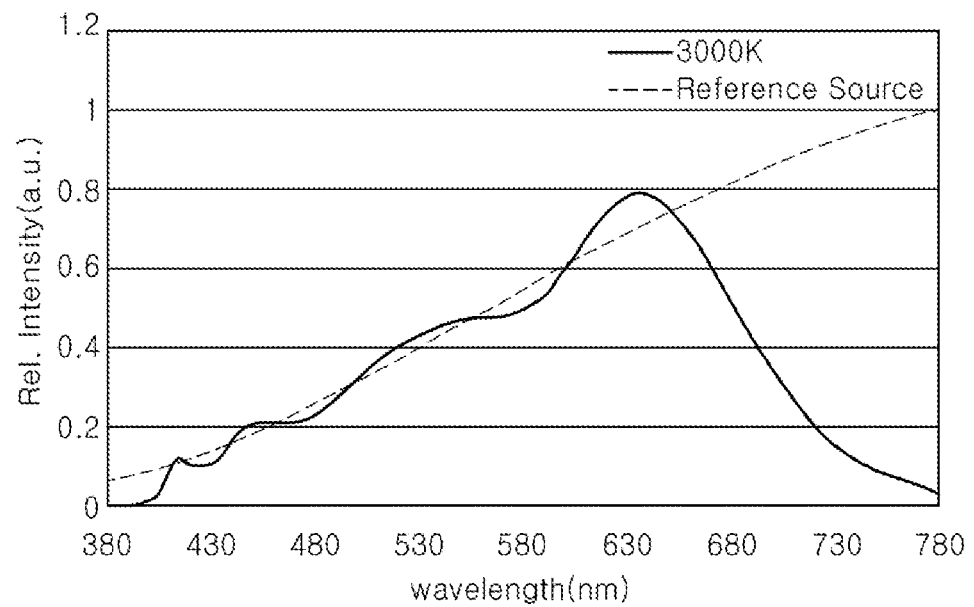
Figure 25:
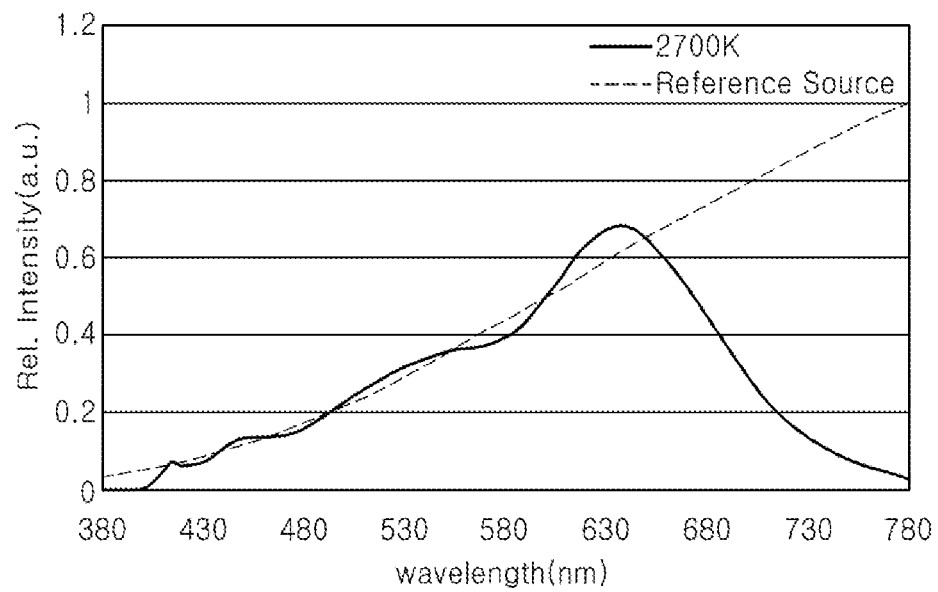
Figure 26:
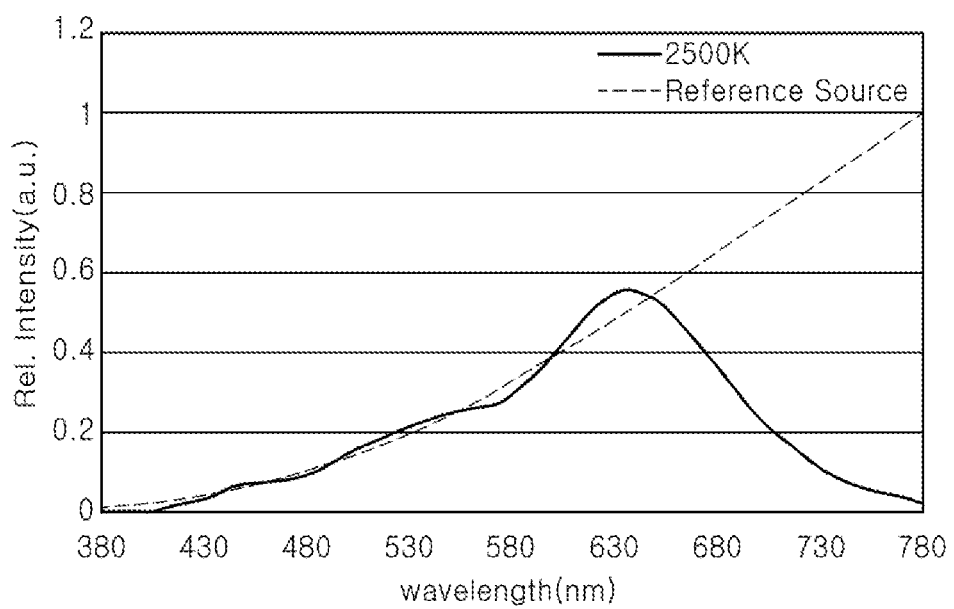
Figure 27:
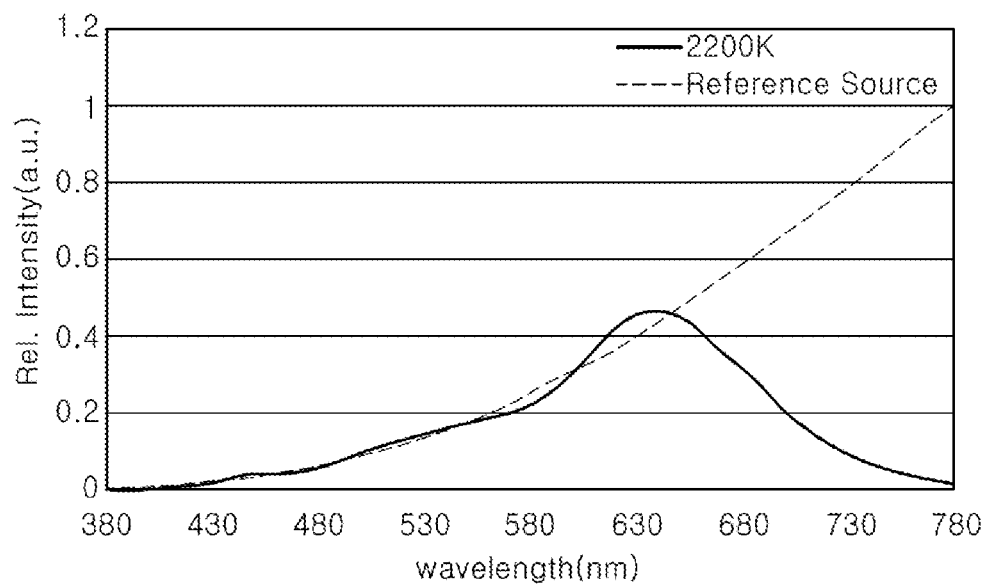
Figure 28:
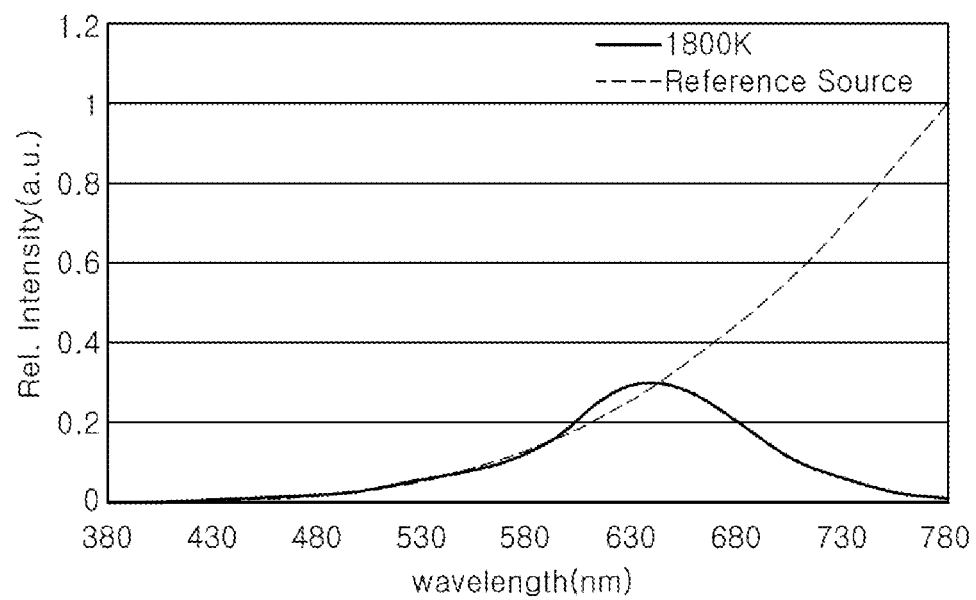

By operating the first to third light emitting units in a dimming manner, it is possible to implement various color temperatures in the range of 1,800K to 10,000K. FIG. 17 to FIG. 18 are graphs comparing various spectra implemented using the first to third light emitting units of FIG. 16 with the spectrum of the reference light source at correlated color temperatures corresponding thereto.

Referring to FIG. 17 to FIG. 28, it can be confirmed that the spectrum at various color temperatures implemented by the first to third light emitting units generally matches with the spectrum by black body radiation in the visible spectrum region. In particular, it can be confirmed that, even at a high color temperature, the intensity of light in the blue wavelength region is not abnormally higher than the intensity of light in other color regions.

Table 2 shows average color rendering indices CRI and fidelity indices at various color temperatures implemented by the first to third light emitting units.

TABLE 2

CRI and fidelity indices of light emitting apparatus according to an exemplary embodiment.

| CCT | CRI | Rf |
|---|---|---|
| 10000 K | 96.2 | 96.9 |
| 6500 K | 97.6 | 98.1 |
| 5700 K | 98.3 | 98.3 |
| 5000 K | 97.3 | 98.2 |
| 4500 K | 97.4 | 97.5 |
| 4000 K | 97.4 | 97.4 |
| 3500 K | 95.6 | 96.8 |
| 3000 K | 95.6 | 96.4 |
| 2700 K | 95.2 | 95.9 |
| 2500 K | 95.6 | 94.8 |
| 2200 K | 95.0 | 94.6 |
| 1800 K | 94.3 | 91.8 |

Referring to Table 2, not only high CRI but also high Rf can be maintained by implementing the color temperature through combination of the first to third light emitting units, thereby implementing light similar to sunlight.

In addition, when the color temperature in a preset range is implemented using each of the first to third light emitting units, it is possible to reduce the number of light emitting units in actual use under the same power consumption. This will be described in more detail below. In order to compare various exemplary embodiments with each other, a drive voltage and a power of each of the light emitting units were set to 3 V and 27 W, respectively.

First, as in the exemplary embodiment described with reference to FIG. 7, when three types of light emitting units 122, 124, 126 respectively corresponding to the above color temperatures are operated at a consumption power of 27 W in a switching on/off manner, 90 light emitting units are used for each color temperature. For example, 90 first light emitting units 122 are operated to implement a color temperature of 6,500K; 90 second light emitting units 122 are operated to implement a color temperature of 4,000K; and 90 third light emitting units 126 are operated to implement a color temperature of 2,700K. In addition, during operation of one type of light emitting unit, for example, the first light emitting units 122, other light emitting units, for example, the second and third light emitting units 124, 126, are kept in a standby state.

Accordingly, for operation at a consumption power of 27 W, a total of 270 light emitting units is required and only 90 light emitting units are operated. On the other hand, in the exemplary embodiment illustrated with reference to FIG. 7, when three types of light emitting units 122, 124, 126 are operated in a dimming manner, among the total of 270 light emitting units, 180 light emitting units may be operated and 90 light emitting units may be kept in a standby state.

In the exemplary embodiment described with reference to FIG. 9, when two types of light emitting units 222, 224 are operated at a consumption power of 27 W in a switching on/off drive manner, 90 light emitting units are used for each color temperature. As such, desired color temperatures can be implemented by a total of 180 light emitting units. In this case, it is difficult to implement a color temperature in the range of, for example, 6,500K to 2,700K on the Planckian locus, and light having color coordinates placed below the Planckian locus is emitted.

When all of the first to third light emitting units 322, 324, 326 are operated at a consumption power of 27 W in a dimming manner to obtain desired color temperatures, for example, 60 light emitting units may be used for each color temperature. As such, desired color temperatures can be implemented using a total of 180 light emitting units.

Further, when the first light emitting unit 322 or the third light emitting unit 326 has the same color coordinates as those of a color temperature to be implemented thereby, the number of first light emitting units 322 or the number of second light emitting units 326 used to implement the color temperature may be 90. Even in this case, only 60 second light emitting units 324 may be used, thereby allowing reduction in the number of light emitting units, as compared with the switching on/off drive manner of FIG. 6.

Figure 29:
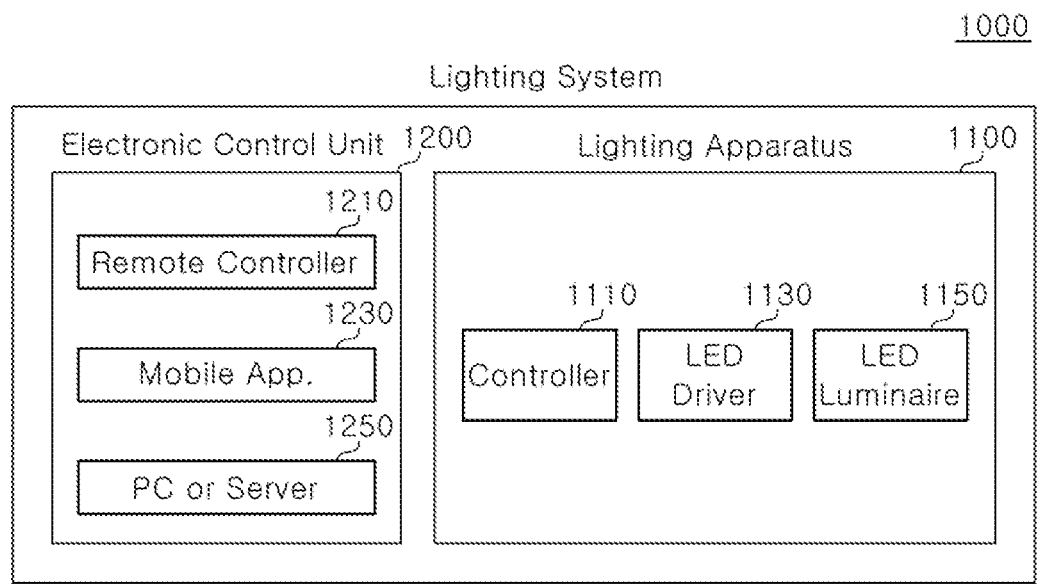
FIG. 29 is a schematic block diagram of a lighting system according to an exemplary embodiment.

FIG. 29 is a schematic block diagram of a lighting system 1000 according to an exemplary embodiment.

Referring to FIG. 29, the lighting system 1000 may include a lighting apparatus 1100 and an electronic control unit 1200 for operation of the lighting apparatus.

The lighting apparatus 1100 includes a controller 1110, an LED driver 1130, and an LED luminaire 1150. The electronic control unit 1200 may include a remote controller 1210, a mobile application 1230, a personal computer (PC) or server 1250, or the like. In some exemplary embodiments, the electronic control unit may be a software.

The LED luminaire 1150 includes the light emitting apparatus according to the exemplary embodiments described above, and thus, can implement light having various color temperatures. As such, repeated descriptions of the light emitting apparatus will be omitted to avoid redundancy.

The electronic control unit 1200 sends a signal to operate the lighting apparatus 1100, and the controller 1110 operate the LED driver 1130 in response to the signal sent from the electronic control unit 1200. Then, the LED driver 1130 operates the light emitting units in the LED luminaire 1150 to emit light having a certain color temperature and brightness. The LED driver 1130 may operate the light emitting units in a dimming manner through pulse width modulation.

The electronic control unit 1200 may change the color temperature of light emitted from the LED luminaire 1150 depending upon time by changing the signal sent therefrom. Accordingly, the electronic control unit 1200 can change the color temperature of light emitted from the LED luminaire 1150 to the same color temperature as the color temperature of sunlight during daytime.

For example, the remote controller 1210 may send an input signal to the controller 1110. The controller 1110 receives the signal through a wireless communication module and drives the LED driver 1130 in response to the signal from the remote controller 1210. The signal may be transferred to the controller 1110 through the mobile application 1230 or through the PC or server 1250. In some exemplary embodiments, the PC or the server 1250 may receive the controller 1110 therein, and the LED driver 1130 may be driven through wired or wireless communication.

According to the illustrated exemplary embodiment, the color temperature and brightness of the LED luminaire 1150 may be controlled outside the lighting apparatus 1100 by a user inputting a control signal through the remote controller 1210, the mobile application 1230, or the server 1250.

Although the lighting apparatus 1100 is described as changing the color temperature and brightness of the LED luminaire 1150 through the electronic control unit 1200, the color temperature and brightness of the LED luminaire 1150 may be directly changed by a user through manipulation of a switch connected to the controller 1110 through a wire, or may be changed through a sensor provided to the LED luminaire 1150.

Figure 30:
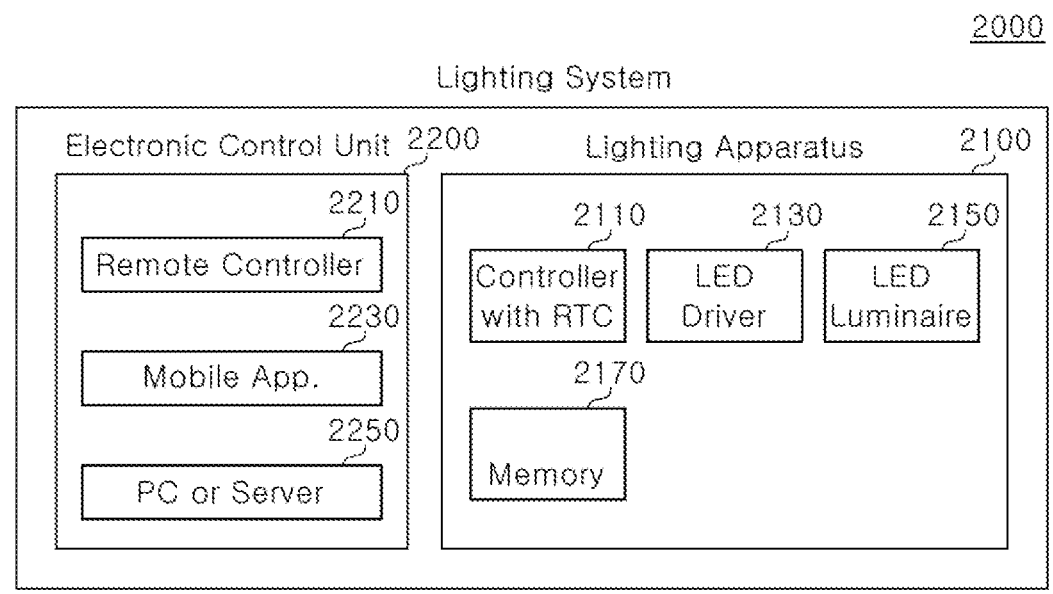
FIG. 30 is a schematic block diagram of a lighting system according to another exemplary embodiment.

FIG. 30 is a schematic block diagram of a lighting system 2000 according to another exemplary embodiment.

Referring to FIG. 30, the lighting system 2000 according to the illustrated exemplary embodiment includes a lighting apparatus 2200 and an electronic control unit 2100 for operation of the lighting apparatus 2200.

The lighting apparatus 2200 includes a controller 2110, an LED driver 2130, an LED luminaire 2150, and a memory 217. The electronic control unit 2100 may include a remote controller 2210, a mobile application 2230, a personal computer (PC) or server 2250, and the like.

The lighting system 2000 according to the illustrated exemplary embodiment is generally similar to the lighting system 1000 shown in FIG. 29, and thus, repeated description of the same components will be omitted to avoid redundancy. The following descriptions will be focused on different features of the lighting system according to the illustrated exemplary embodiment.

Unlike the lighting system of FIG. 29, the controller 2110 of the lighting system 2000 includes a real time clock (RTC). The RTC may be included in the form of an integrated circuit in the controller 2110. Since the controller 2110 includes the RCT, a control module 2110 may control the LED luminaire 2150 according to a schedule without receiving an external signal.

For example, the color temperature and brightness of sunlight according to time in each season may be stored in the memory 2170, and the controller 2110 may control the light emitting apparatus 2200 in the LED luminaire 2150 through the RTC to emit light having a similar color temperature and brightness to the color temperature and brightness of sunlight according to time in each season. Accordingly, the LED luminaire 2150 may illuminate an indoor space while changing the color temperature corresponding to change in the color temperature of sunlight during daytime.

Table 3 shows one example of a scenario of a color temperature change according to time in each season using the LED luminaire 2150 configured to emit light having a color temperature in the range of 2,200K to 6,500K. The color temperature was set to maintain at 2,200K after sunset and to change to a color temperature similar to the color temperature of sunlight during daytime. Table 3 shows one example of a color temperature change depending on time, and such a color temperature change depending on time may be arbitrarily set.

TABLE 3

Color temperature scenario in each season.

| time | Season | | | |
| --- | --- | --- | --- | --- |
| | Spring | Summer | Autumn | Winter |
| 0 | 2200 K | 2200 K | 2200 K | 2200 K |
| 1 | 2200 K | 2200 K | 2200 K | 2200 K |
| 2 | 2200 K | 2200 K | 2200 K | 2200 K |
| 3 | 2200 K | 2200 K | 2200 K | 2200 K |
| 4 | 2200 K | 2700 K | 2200 K | 2200 K |
| 5 | 2700 K | 3500 K | 2700 K | 2200 K |
| 6 | 3500 K | 3500 K | 3500 K | 2700 K |
| 7 | 3500 K | 3500 K | 3500 K | 3500 K |
| 8 | 3500 K | 3500 K | 3500 K | 3500 K |
| 9 | 3500 K | 3500 K | 3500 K | 3500 K |
| 10 | 3500 K | 3500 K | 3500 K | 3500 K |
| 11 | 3500 K | 3500 K | 3500 K | 3500 K |
| 12 | 6500 K | 6500 K | 6500 K | 6500 K |
| 13 | 6500 K | 6500 K | 6500 K | 6500 K |
| 14 | 6500 K | 6500 K | 6500 K | 6500 K |

TABLE 3-continued

Color temperature scenario in each season.

| | Season | | | |
|---|---|---|---|---|
| time | Spring | Summer | Autumn | Winter |
| 15 | 6500 | 6500 K | 6500 K | 6500 K |
| 16 | 6500 K | 6500 K | 6500 K | 6500 K |
| 17 | 6500 K | 6500 K | 6500 K | 2700 K |
| 18 | 2700 K | 6500 K | 2700 K | 2500 K |
| 19 | 2500 K | 2700 K | 2500 K | 2300 K |
| 20 | 2300 K | 2500 K | 2300 K | 2200 K |
| 21 | 2200 K | 2300 K | 2200 K | 2200 K |
| 22 | 2200 K | 2200 K | 2200 K | 2200 K |
| 23 | 2200 K | 2200 K | 2200 K | 2200 K |

In addition, although the color temperature is set to change every hour in Table 1, the color temperature may be set to change every 30 minutes, 10 minutes, or several minutes.

According to the illustrated embodiment, since the RTC is embedded in the lighting apparatus 2200, the lighting apparatus 2200 may automatically change the color temperature corresponding to the color temperature of sunlight without the electronic control unit 2100. Accordingly, even when the electronic control unit 2100 is in a turned-off state, the lighting apparatus 2200 can automatically change the color temperature and brightness.

The lighting apparatus 2200 may be operated in various modes, which may be selected through the electronic control unit 2100. For example, control of the color temperature using the RTC may be selected through the remote controller 2210, the mobile application 2230, or the PC or server 2250. In addition, in a particular mode, the lighting apparatus 2200 may be controlled through the electronic control unit 2100, or may be manually controlled through a switch. The controller 2110 may include a wireless communication module to receive signals sent from the so electronic control unit 2100.

Human biorhythms are different according to age, and thus, according to an exemplary embodiment, an illumination mode may be set to implement lighting optimized for biorhythms according to age. For example, persons may be divided into age groups including infancy, childhood, adolescence, and adulthood, and lighting time zones of cool white and warm white may be differently adjusted.

Figure 31:
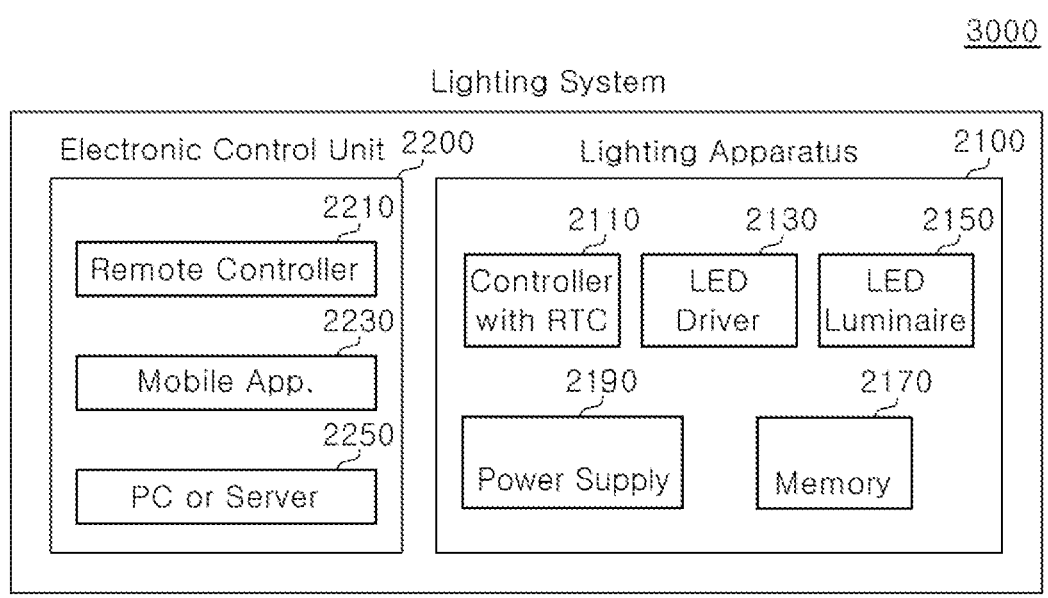
FIG. 31 is a schematic block diagram of a lighting system according to a further exemplary embodiment.

FIG. 31 is a schematic block diagram of a lighting system 3000 according to a further exemplary embodiment.

Referring to FIG. 31, the lighting system 3000 according to the illustrated exemplary embodiment is similar to the lighting system 2000 of FIG. 30, except that the lighting system 3000 further includes an RTC power supply 2190 supplying power to the RTC.

The lighting apparatus 2100 may be operated by power supplied from an external power source (or main power source). The RTC may receive power supplied from the external power source. Here, when the external power source is blocked in order to turn off the LED luminaire 2150 or due to an abnormal condition, power supply to the RTC is blocked. In this case, the RTC cannot be normally operated and fails to recognize the time. Then, even when power is supplied again thereto from the external power source, the RTC is not operated in association with an actual time progress. As such, the lighting apparatus 2100 cannot change the color temperature in real time in association with change in color temperature of sunlight.

The RTC power supply 2190 prevents the RTC from being turned off by supplying power to the RTC when the external power source or the main power source is blocked. In this manner, the RTC can keep the actual time progress.

The RTC power supply 2190 is connected to the RTC in the lighting apparatus 2100 to supply power to the RTC. The RTC power supply 2190 may be connected to the RTC to be charged with the external power source turned on and to be discharged with the external power source blocked.

The RTC power supply 2190 may be, for example, a primary battery or a secondary battery. For example, the RTC power supply 2190 may be a lithium battery or a lithium ion battery.

Although the primary battery does not require a separate charge circuit, the primary battery has relatively short lifespan, and thus, may require frequent replacement depending upon lifespan thereof.

On the other hand, although the secondary battery allows charge and discharge, and thus, does not require frequent replacement, the secondary battery has a restricted operation temperature. Generally, the lighting apparatus 2100 is driven for a long period of time and the interior temperature of the lighting apparatus 2100 can reach 60° C. or more. However, since the secondary battery is not suitable for use at a temperature of 60° C. or more, the secondary battery cannot be used in the lighting apparatus 2100 which is used for a long period of time.

According to an exemplary embodiment, the RTC power supply 2190 may be a super capacitor. The super capacitor is operated at a temperature of about −40° C. to 85° C., and is thus suitable for operation conditions of the lighting apparatus 2100. In addition, the super capacitor has much longer lifespan than the primary battery or the secondary battery, and can be charged by an external power source. Thus, the super capacitor does not require replacement.

Although some embodiments have been described herein, it should be understood by those skilled in the art that these embodiments are given by way of illustration only and that various modifications, changes, and alterations can be made without departing from the spirit and scope of the present disclosure. In addition, individual structures, elements, or features of a particular embodiment can be applied to other embodiments without departing from the spirit and scope of the present disclosure.

What is claimed is:

1. A lighting apparatus comprising:
   a controller; and
   an LED luminaire configured to implement a color temperature from a minimum color temperature of 3,000K or less to a maximum color temperature of 5,000K or more, the LED luminaire comprising a light emitting apparatus including at least one first light emitter, at least one second light emitter, and at least one third light emitter,
   wherein the controller is configured to control the first, second, and third light emitters to change the color temperature of the LED luminaire,
   wherein a triangle region defined by color coordinates of the first light emitter, the second light emitter, and the third light emitter comprises at least a region on a Planckian locus, and the maximum color temperature and the minimum color temperature included in the triangle region are 5,000K or more, and 3,000K or less, respectively,
   wherein in the CIE-1931 coordinate system, the color coordinates of the at least one first light emitter is closer to a color temperature of 5,000K than those of the at least one second light emitter and the at least one third light emitter, and the color coordinates of the at least one third light emitter is closer to a color temperature of 3,000K than those of the at least one first light emitter and the at least one second light emitter.

2. The lighting apparatus of claim 1, wherein the controller is configured to operate the first, second, and third emitters in response to a signal received from an electronic controller.

3. The lighting apparatus of claim 2, wherein the electronic controller includes a remote controller, a mobile application, a personal computer, a server, or a software.

4. The lighting apparatus of claim 2, wherein the electronic controller is configured to change the signal to change the color temperature of light emitted from the LED luminaire based on time.

5. The lighting apparatus of claim 3, wherein the color temperature and brightness of the LED luminaire is configured to be controlled based on a user input through the remote controller, the mobile application, or the server.

6. The lighting apparatus of claim 1, wherein the lighting apparatus is configured to automatically adjust the color temperature and brightness of light emitted from the LED luminaire for a day without an external input.

7. The lighting apparatus of claim 1, wherein a color temperature of light implemented by the first, second, and third emitters has high fidelity (Rf), and the Rf of at least a fraction of light having a color temperature from 2700K to 6500K is 95 or more.

8. The lighting apparatus of claim 1, wherein the first, second and third light emitter are configured to be driven in a dimming manner.

9. A lighting apparatus comprising:
a controller; and
an LED luminaire configured to implement a color temperature from a minimum color temperature of 3,000K or less to a maximum color temperature of 5,000K or more, the LED luminaire comprising a light emitting apparatus including at least one first light emitter, at least one second light emitter, and at least one third light emitter,
wherein the controller is configured to control the first, second, and third emitters to change the color temperature of the LED luminaire,
wherein a maximum color temperature included in a triangle region defined by color coordinates of the first light emitter, the second light emitter, and the third light emitter is 5,000K or more,
wherein a minimum color temperature included in the triangle region defined by color coordinates of the first light emitter, the second light emitter, and the third light emitter is 3,000K or less, and
wherein in the CIE-1931 coordinate system, the color coordinates of the at least one first light emitter is closer to a color temperature of 5,000K than those of the at least one second light emitter and the at least one third light emitter, and the color coordinates of the at least one third light emitter is closer to a color temperature of 3,000K than those of the at least one first light emitter and the at least one second light emitter.

10. The lighting apparatus of claim 9, wherein the color temperature and brightness of the LED luminaire is configured to be controlled by a user input through a remote controller, a mobile application, or a server.

11. The lighting apparatus of claim 9, wherein a color temperature of light implemented by the first, second, and third light emitters has high fidelity (Rf).

12. The lighting apparatus of claim 11, wherein the Rf of at least a fraction of light having a color temperature from 2700K to 6500K is 95 or more.

13. A lighting apparatus comprising:
a controller; and
an LED luminaire configured to implement a color temperature from a minimum color temperature of 3,000K or less to a maximum color temperature of 5,000K or more, the LED luminaire comprising a light emitting apparatus including a plurality of light emitters,
wherein the controller is configured to control the plurality of light emitters to change the color temperature of the LED luminaire,
wherein a region defined by color coordinates of the plurality of light emitters comprises at least a region on a Planckian locus, and the maximum color temperature and the minimum color temperature included in the region are 5,000K or more, and 3,000K or less, respectively,
wherein a color temperature of light implemented by the plurality of the light emitters has high fidelity (Rf), and
wherein the Rf of at least a fraction of light having a color temperature from 2700K to 6500K is 95 or more.

14. The lighting apparatus of claim 13, wherein the controller is configured to operate the plurality of light emitters in response to a signal received from an electronic controller.

15. The lighting apparatus of claim 14, wherein the electronic controller includes a remote controller, a mobile application, a personal computer, a server, and a software.

16. The lighting apparatus of claim 15, wherein the color temperature and brightness of the LED luminaire is configured to be controlled by a user input through the remote controller, the mobile application, or the server.

17. The lighting apparatus of claim 14, wherein the electronic controller is configured to change the signal to change the color temperature of light emitted from the LED luminaire based on time.

18. The lighting apparatus of claim 13, wherein the lighting apparatus is configured to automatically adjust the color temperature and brightness of light emitted from the LED luminaire for a day without an external input.

19. The lighting apparatus of claim 13, wherein the plurality of light emitters comprises at least one first light emitter, at least one second light emitter, and at least one third light emitter.

20. The lighting apparatus of claim 19, wherein the region defined by the color coordinates of the first light emitter, the second light emitter, and the third light emitter has a triangular shape.

* * * * *